United States Patent
Yan et al.

(10) Patent No.: US 8,822,243 B2
(45) Date of Patent: Sep. 2, 2014

(54) LIGHT EMITTING DEVICES HAVING LIGHT COUPLING LAYERS WITH RECESSED ELECTRODES

(71) Applicant: Toshiba Techno Center Inc., Tokyo (JP)

(72) Inventors: Li Yan, Pleasanton, CA (US); Chao-kun Lin, San Jose, CA (US); Chih-Wei Chuang, Albany, CA (US)

(73) Assignee: Manutius IP Inc., Los Altos, CA (US)

( * ) Notice: Subject to any disclaimer, the term of this patent is extended or adjusted under 35 U.S.C. 154(b) by 0 days.

(21) Appl. No.: 14/155,090

(22) Filed: Jan. 14, 2014

(65) Prior Publication Data

US 2014/0127841 A1    May 8, 2014

Related U.S. Application Data

(62) Division of application No. 13/249,196, filed on Sep. 29, 2011, now Pat. No. 8,664,679.

(51) Int. Cl.
*H01L 29/06* (2006.01)

(52) U.S. Cl.
USPC ............... 438/22; 438/29; 438/46; 438/47; 438/93; 438/604; 257/E33.064

(58) Field of Classification Search
USPC ............ 438/22–29, 46–47, 93–94, 518, 602, 438/604
See application file for complete search history.

(56) References Cited

U.S. PATENT DOCUMENTS

| | | | |
|---|---|---|---|
| 6,984,841 B2 * | 1/2006 | Tsuda et al. | 257/12 |
| 7,244,957 B2 * | 7/2007 | Nakajo et al. | 257/13 |
| 8,232,568 B2 * | 7/2012 | Zhang et al. | 257/94 |
| 2001/0020376 A1 * | 9/2001 | Chang | 68/23.2 |
| 2010/0044718 A1 * | 2/2010 | Hanser et al. | 257/76 |
| 2011/0227037 A1 * | 9/2011 | Su | 257/13 |

* cited by examiner

*Primary Examiner* — Thanh Nguyen
(74) *Attorney, Agent, or Firm* — Hogan Lovells US LLP

(57) ABSTRACT

A light emitting device comprises a first layer of an n-type semiconductor material, a second layer of a p-type semiconductor material, and an active layer between the first layer and the second layer. A light coupling structure is disposed adjacent to one of the first layer and the second layer. In some cases, the light coupling structure is disposed adjacent to the first layer. An orifice formed in the light coupling structure extends to the first layer. An electrode formed in the orifice is in electrical communication with the first layer.

20 Claims, 8 Drawing Sheets

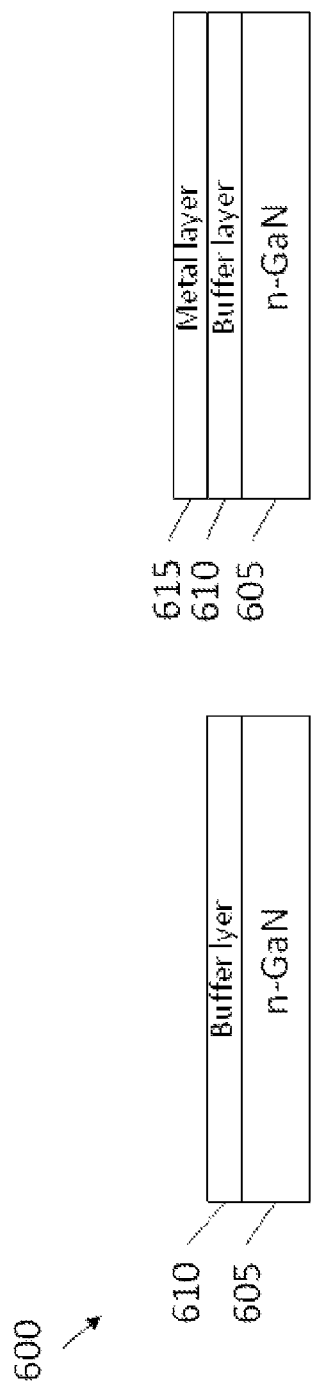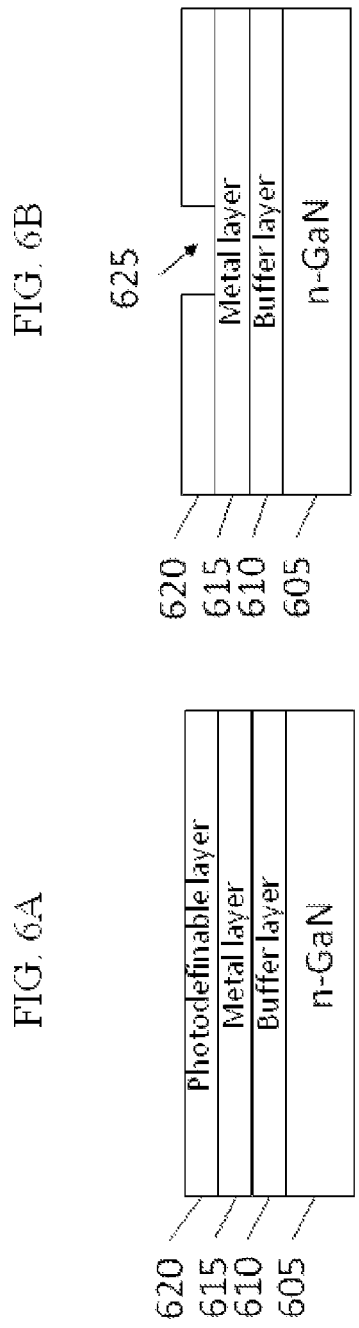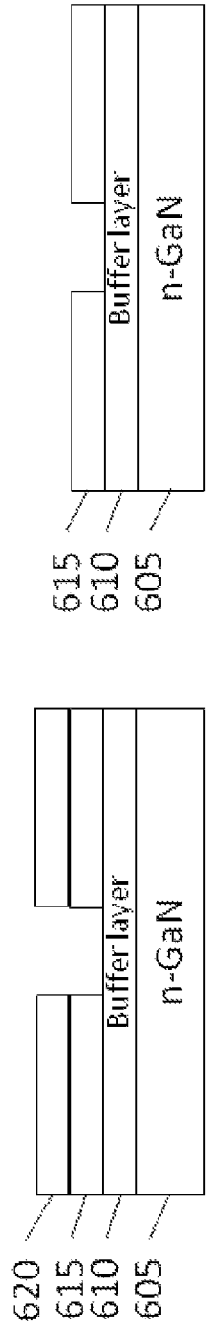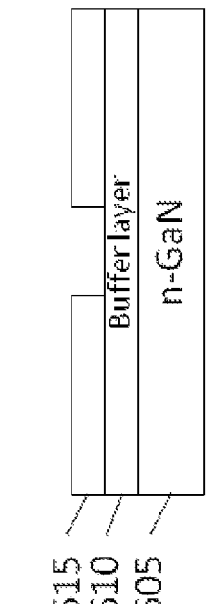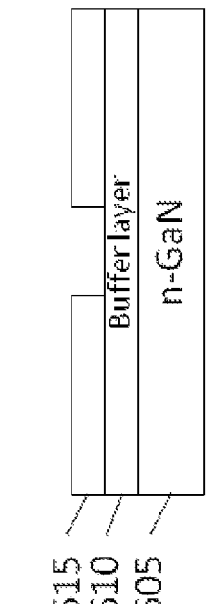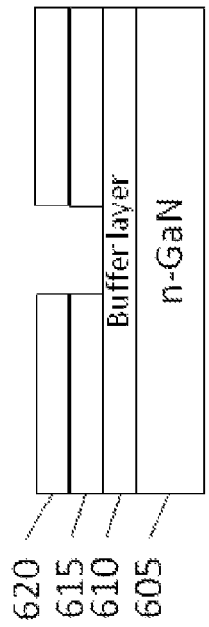

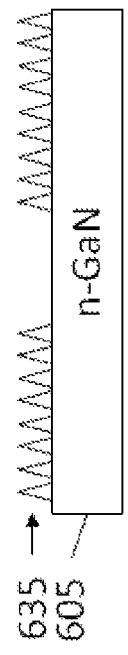
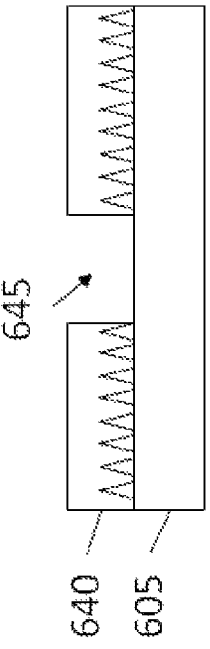
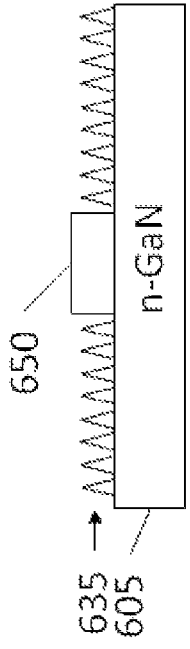
FIG. 6G  FIG. 6H  FIG. 6J
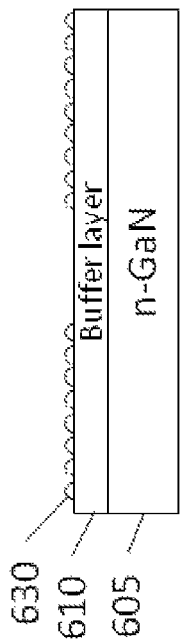
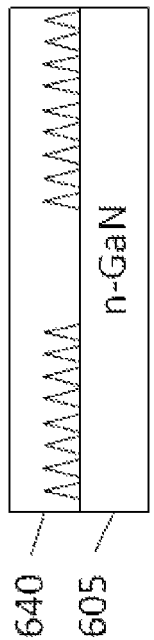
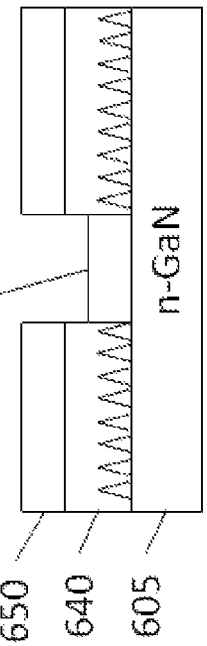
FIG. 6K  FIG. 6I  FIG. 6L

LIGHT EMITTING DEVICES HAVING LIGHT COUPLING LAYERS WITH RECESSED ELECTRODES

RELATED APPLICATIONS

This application is a divisional of and claims priority to U.S. patent application Ser. No. 13/249,196 filed Sep. 29, 2011, which is expressly incorporated herein by reference in its entirety.

BACKGROUND

Lighting applications typically use incandescent or gas-filled bulbs. Such bulbs typically do not have long operating lifetimes and thus require frequent replacement. Gas-filled tubes, such as fluorescent or neon tubes, may have longer lifetimes, but operate using high voltages and are relatively expensive. Further, both bulbs and gas-filled tubes consume substantial amounts of energy.

A light emitting diode (LED) is a device that emits light upon the recombination of electrons and holes. An LED typically includes a chip of semiconducting material doped with impurities to create a p-n junction. Current flows from the p-side, or anode, to the n-side, or cathode. Charge-carriers—electrons and holes—flow into the p-n junction from electrodes with different voltages. When electrons meet holes, the electrons recombine with the holes in a process that may result in the radiative emission of energy in the form of photons (hv). The photons, or light, are transmitted out of the LED and employed for use in various applications, such as, for example, lighting applications and electronics applications.

LED's, in contrast to incandescent or gas-filled bulbs, are relatively inexpensive, operate at low voltages, and have long operating lifetimes. Additionally, LED's consume relatively little power and are compact. These attributes make LEDs particularly desirable and well suited for many applications.

Despite the advantages of LED's, there are limitations associated with such devices. Such limitations include materials limitations, which may limit the efficiency of LED's; structural limitations, which may limit transmission of light generated by an LED out of the device; and manufacturing limitations, which may lead to high processing costs. Accordingly, there is a need for improved LED's and methods for manufacturing LED's.

SUMMARY

In an aspect of the invention, light emitting devices, including light emitting diodes (LED's), are provided. In an embodiment, a light emitting device includes a substrate, a p-type Group III-V semiconductor layer adjacent to the substrate, an active layer adjacent to the p-type semiconductor layer, and an n-type Group III-V semiconductor layer adjacent to the active layer. A light coupling structure adjacent to the n-type Group III-V semiconductor layer includes one or more Group III-V semiconductor materials. The light coupling structure includes an orifice extending to the n-type Group III-V semiconductor layer. An electrode formed in the orifice is in electrical communication with the n-type Group III-V semiconductor layer.

In another embodiment, a light emitting diode includes a substrate and a first layer adjacent to the substrate, the first layer having one of a p-type Group III-V semiconductor and an n-type Group III-V semiconductor. A second layer adjacent to the first layer includes an active material configured to generate light upon the recombination of electrons and holes in the active material. A third layer adjacent to the second layer includes the other of the p-type Group III-V semiconductor and the n-type Group III-V semiconductor. A light coupling structure adjacent to the third layer includes one or more Group III-V semiconductor materials. The light coupling structure includes an opening extending to the third layer. An electrode disposed in the opening is in electrical communication (e.g., ohmic contact) with the third layer.

In another embodiment, a light emitting device includes a first layer of a first type of Group III-V semiconductor material and a second layer adjacent to the first layer. The second layer includes an active material configured to generate light upon the recombination of electrons and holes. A third layer adjacent to the second layer includes a second type of Group III-V semiconductor material. A light coupling structure adjacent to the third layer includes a third type of Group III-V semiconductor material. The light coupling structure includes an opening extending through at least a portion of the light coupling structure. An electrode adjacent to the light coupling structure is in electrical communication with one of the first layer and the second layer. In some cases, the third type of Group III-V semiconductor material is different from the first type of Group III-V semiconductor material and the second type of Group III-V semiconductor material.

In another aspect of the invention, methods for forming light emitting devices, including light emitting diodes, are provided. In an embodiment, a method for forming a light emitting device includes providing, in a reaction chamber (or a reaction space if the reaction chamber includes multiple reaction spaces), a light coupling structure over a substrate. The light coupling structure includes an opening exposing one of an n-type semiconductor layer and a p-type semiconductor layer adjacent to the light coupling structure. The light coupling structure includes a Group III-V semiconductor material. An electrode is then formed in the opening, the electrode in electrical communication with one of the n-type semiconductor layer and the p-type semiconductor layer that is formed adjacent to an active layer. The active layer is formed adjacent to the other of the n-type semiconductor layer and the p-type semiconductor layer. The other of the n-type semiconductor layer and the p-type semiconductor layer is formed adjacent to the substrate.

In another embodiment, a method for forming a light emitting device includes providing, in a reaction chamber, a substrate having a buffer layer, and roughening a portion of the buffer layer to form a light coupling layer. The light coupling layer is formed adjacent to one of an n-type semiconductor layer and a p-type semiconductor layer that is formed adjacent to an active layer. The active layer is formed adjacent to the other of the n-type semiconductor layer and the p-type semiconductor layer. The other of the n-type semiconductor layer and the p-type semiconductor layer is formed adjacent to the substrate.

In another embodiment, a method for forming a light emitting device includes forming a buffer layer adjacent to a first substrate in a reaction chamber and forming an n-type Group III-V semiconductor layer adjacent to the buffer layer. An active layer is formed adjacent to the n-type Group III-V semiconductor layer, and a p-type Group III-V semiconductor layer is formed adjacent to the active layer. A second substrate is then provided adjacent to the p-type Group III-V semiconductor layer. The first substrate is then removed to expose the buffer layer. A light coupling layer is then formed from the buffer layer. The light coupling layer includes an opening extending to the n-type Group III-V semiconductor layer. An electrode is then provided in the opening.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings of which:

FIGS. 6A-6L schematically illustrate a method for forming a light coupling layer and an electrode over an n-type gallium nitride layer, in accordance with an embodiment of the invention.

DETAILED DESCRIPTION

Figure 1:
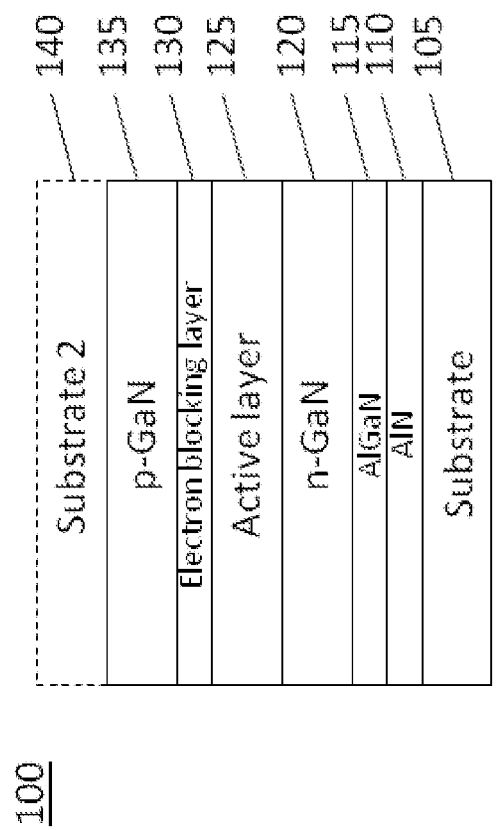
FIG. 1 schematically illustrates a light emitting diode.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed in practicing the invention.

The term "light emitting device," as used herein, refers to a device configured to generate light upon the recombination of electrons and holes in a light emitting region (or "active layer") of the device, such as upon the application (or flow) of a forward-biasing electrical current through the light emitting region. A light emitting device in some cases is a solid state device that converts electrical energy to light. A light emitting diode ("LED") is a light emitting device. There are many different LED device structures that are made of different materials and have different structures and perform in a variety of ways. Some light emitting devices emit laser light, and others generate non-monochromatic light. Some LED's are optimized for performance in particular applications. An LED may be a so-called blue LED including a multiple quantum well (MQW) active layer having indium gallium nitride. A blue LED may emit non-monochromatic light having a wavelength in a range from about 440 nanometers to 500 nanometers. A phosphor coating may be provided that absorbs some of the emitted blue light. The phosphor in turn fluoresces to emit light of other wavelengths so that the light the overall LED device emits has a wider range of wavelengths.

The term "layer," as used herein, refers to a layer of atoms or molecules on a substrate. In some cases, a layer includes an epitaxial layer or a plurality of epitaxial layers. A layer may include a film or thin film. In some situations, a layer is a structural component of a device (e.g., light emitting diode) serving a predetermined device function, such as, for example, an active layer that is configured to generate (or emit) light. A layer generally has a thickness from about one monoatomic monolayer (ML) to tens of monolayers, hundreds of monolayers, thousands of monolayers, millions of monolayers, billions of monolayers, trillions of monolayers, or more. In an example, a layer is a multilayer structure having a thickness greater than one monoatomic monolayer. In addition, a layer may include multiple material layers (or sub-layers). In an example, a multiple quantum well active layer includes multiple well and barrier layers. A layer may include a plurality of sub-layers. For example, an active layer may include a barrier sub-layer and a well sub-layer.

The term "coverage," as used herein, refers to the fraction of a surface covered or occupied by a species in relation the total area of the surface. For example, a coverage of 10% for a species indicates that 10% of a surface is covered by the species. In some situations, coverage is represented by monolayers (ML), with 1 ML corresponding to complete saturation of a surface with a particular species. For example, a pit coverage of 0.1 ML indicates that 10% of a surface is occupied by pits.

The term "active region" (or "active layer"), as used herein, refers to a light emitting region of a light emitting diode (LED) that is configured to generate light. An active layer includes an active material that generates light upon the recombination of electrons and holes with the aid of an electrical potential applied across the active layer. An active layer may include one or a plurality of layers (or sub-layers). In some cases, an active layer includes one or more barrier layers (or cladding layers, such as, e.g., GaN) and one or more quantum well ("well") layers (such as, e.g., InGaN). In an example, an active layer includes multiple quantum wells, in which case the active layer may be referred to as a multiple quantum well ("MQW") active layer.

The term "doped," as used herein, refers to a structure or layer that is chemically doped. A layer may be doped with an n-type chemical dopant (also "n-doped" herein) or a p-type chemical dopant (also "p-doped" herein). In some cases, a layer is undoped or unintentionally doped (also "u-doped" or "u-type" herein). In an example, a u-GaN (or u-type GaN) layer includes undoped or unintentionally doped GaN.

The term "adjacent" or "adjacent to," as used herein, includes 'next to', 'adjoining', 'in contact with', and 'in proximity to'. In some instances, adjacent to components are separated from one another by one or more intervening layers. For example, the one or more intervening layers can have a thickness less than about 10 micrometers ("microns"), 1 micron, 500 nanometers ("nm"), 100 nm, 50 nm, 10 nm, 1 nm, or less. In an example, a first layer is adjacent to a second layer when the first layer is in direct contact with the second layer. In another example, a first layer is adjacent to a second layer when the first layer is separated from the second layer by a third layer.

The term "substrate," as used herein, refers to any workpiece on which film or thin film formation is desired. A substrate includes, without limitation, silicon, germanium, silica, sapphire, zinc oxide, carbon (e.g., graphene), SiC, AlN, GaN, spinel, coated silicon, silicon on oxide, silicon carbide on oxide, glass, gallium nitride, indium nitride, titanium dioxide and aluminum nitride, a ceramic material (e.g., alumina, AlN), a metallic material (e.g., molybdenum, tungsten, copper, aluminum), and combinations (or alloys) thereof.

The term "Group III-V semiconductor," as used herein, refers to a material having one or more Group III species (e.g., aluminum, gallium, indium) and one or more Group V species (e.g., nitrogen, phosphorous). A Group III-V semiconductor material in some cases is selected from gallium nitride (GaN), gallium arsenide (GaAs), aluminum gallium arsenide (AlGaAs), gallium arsenide phosphide (GaAsP), aluminum gallium indium phosphide (AlGaInP), gallium phosphide (GaP), indium gallium nitride (InGaN), aluminum gallium phosphide (AlGaP), aluminum nitride (AlN), aluminum gallium nitride (AlGaN), and aluminum gallium indium nitride (AlGaInN).

The term "dopant," as used herein, refers to a chemical dopant, such as an n-type dopant or a p-type dopant. P-type dopants include, without limitation, magnesium, beryllium, zinc and carbon. N-type dopants include, without limitation, silicon, germanium, tin, tellurium, and selenium. A p-type semiconductor is a semiconductor that is doped with a p-type dopant. An n-type semiconductor is a semiconductor that is doped with an n-type dopant. An n-type Group III-V material, such as n-type gallium nitride ("n-GaN"), includes a Group III-V material that is doped with an n-type dopant. A p-type Group III-V material, such as p-type GaN ("p-GaN"), includes a Group III-V material that is doped with a p-type dopant. A Group III-V material includes at least one Group III element selected from boron, aluminum, gallium, indium, and thallium, and at least one Group V element selected from nitrogen, phosphorus, arsenic, antimony and bismuth.

The term "injection efficiency," as used herein, refers to the proportion of electrons passing through a light emitting device that are injected into the active region of the light emitting device.

The term "internal quantum efficiency," as used herein, refers to the proportion of all electron-hole recombination events in an active region of a light emitting device that are radiative (i.e., producing photons).

The term "extraction efficiency," as used herein, refers to the proportion of photons generated in an active region of a light emitting device that escape from the device.

The term "external quantum efficiency" (EQE), as used herein, refers to the ratio of the number of photons emitted from an LED to the number of electrons passing through the LED. That is, EQE=Injection efficiency×Internal quantum efficiency×Extraction efficiency.

The term "light coupling structure," as used herein, refers to a structure configured to permit light to transmit from a first medium to a second medium. The first medium has a first index of refraction and the second medium has a second index of refraction that may be different from the first index of refraction. A light coupling structure (or layer) couples light from the first medium to the second medium.

The term "orifice," as used herein, means opening or hole. An orifice, in some cases, is a cavity. An orifice includes an opening (such as a vent, mouth, or hole) through which an object may pass. In some embodiments, an orifice is a recessed region. In some cases, an orifice is an etched-back region. An orifice can be filled with a material, including, but not limited to, a metallic or semiconductor material.

While silicon provides various advantages, such as the ability to use commercially available semiconductor fabrication techniques adapted for use with silicon, the formation of a Group III-V semiconductor-based LED on a silicon substrate poses various limitations. As an example, the lattice mismatch and the mismatch in coefficient of thermal expansion between silicon and gallium nitride leads to structural stresses that generate defects upon the formation of gallium nitride thin films, such as dislocations.

LED's may be formed of various semiconductor device layers. In some situations, Group III-V semiconductor LED's offer device parameters (e.g., wavelength of light, external quantum efficiency) that may be preferable over other semiconductor materials. Gallium nitride (GaN) is a binary Group III-V direct bandgap semiconductor that may be used in optoelectronic applications and high-power and high-frequency devices.

Group III-V semiconductor based LED's may be formed on various substrates, such as silicon, germanium, sapphire, or silicon carbide (SiC). Silicon provides various advantages over other substrates, such as the capability of using current manufacturing and processing techniques, in addition to using large wafer sizes that aid in maximizing the number of LED's formed within a predetermined period of time. FIG. 1 shows an LED 100 having a substrate 105, an AlN layer 110 adjacent to the substrate 105, an AlGaN layer 115 adjacent to the AlN layer 110, an n-type GaN ("n-GaN") layer 120 adjacent to the buffer layer 115, an active layer 125 adjacent to the n-GaN layer 120, an electron blocking (e.g., AlGaN) layer 130 adjacent to the active layer 125, and a p-type GaN ("p-GaN") layer 135 adjacent to the electron blocking layer 130. The electron blocking layer 130 is configured to minimize the recombination of electrons with holes in the p-GaN layer 135. In some cases, the LED 100 includes a u-type GaN ("u-GaN") layer between the AlGaN layer 115 and the n-GaN layer 120. The u-GaN layer may provide for enhanced coalescence between the AlGaN layer 115 and the n-GaN layer 120. The substrate 100 may be formed of silicon. In some situations, the LED 100 includes a substrate 140 (Substrate 2) adjacent to the p-GaN layer 135. In such a case, the substrate 105 may be precluded. In some cases, the AlGaN layer 110 is part of the buffer layer 115.

While silicon provides various advantages, the formation of Group III-V semiconductor based LED's on a silicon substrate poses various limitations. As an example, the lattice mismatch and mismatch in coefficient of thermal expansion between silicon and gallium nitride may generate structural stresses that may lead to high defect densities and cracking issues in LED devices. In an example, for an LED having a GaN epitaxial layer (also "epilayer" herein) on a silicon substrate, as the GaN epilayer gets thicker, the stress in the epilayer increases. The increase in stress may lead to the silicon wafer to bow and crack. The cracking issue is more severe for a GaN layer that is n-doped with silicon, due at least in part to a high tensile strain in silicon-doped GaN. The thickness of the silicon-doped GaN layer may be selected to avoid cracking. The thickness limitation of Group III-V semiconductor layers on silicon imposes various challenges to forming Group III-V semiconductor-based LED's with desirable performance characteristics.

In some cases, the extraction efficiency of LED devices may be improved with the aid of a light a coupling layer formed from a portion of an n-type semiconductor layer adjacent to an active layer of the LED. The light coupling layer couples light generated in the active layer of the LED from a first medium to a second medium, such as from a medium within the LED to an external environment. However, with the light coupling layer formed from the n-type semiconductor layer, part of the n-type semiconductor layer is sacrificed for optical extraction and, consequently, the effective n-type semiconductor layer thickness for current spreading is reduced. In such a case, a thicker n-type semiconductor layer may be necessary for both adequate roughening and current spreading. However, the use of a thick n-type semiconductor layer makes the growth of crack-free device layers difficult.

Structures and methods provided herein advantageously enable the formation of Group III-V semiconductor-based LED devices on silicon with a reduction in, if not an elimination of, cracking, while providing for devices with desirable performance characteristics (e.g., external quantum efficiency). In some embodiments, a roughened u-type Group III-V semiconductor (e.g., u-GaN) layer over an n-type Group III-V semiconductor (e.g., n-GaN) layer is used as a light coupling layer (or light coupling structure). In some situations, a roughened buffer layer is provided over (or adjacent to) the n-type Group III-V semiconductor layer. The roughening of the n-type Group III-V semiconductor layer, in such cases, may be reduced, if not eliminated, thereby providing for optimized current spreading while advantageously enabling the use of a relatively thin Group III-V semiconductor layer, thereby aiding in avoiding cracking.

Light Emitting Devices with Light Coupling Layers

In an aspect of the invention, a light emitting device includes a substrate, a p-type semiconductor layer adjacent to the substrate, an active layer adjacent to the p-type semiconductor layer, and an n-type semiconductor layer adjacent to the active layer. The light emitting device includes a light coupling structure adjacent to the n-type or p-type semiconductor layer. In some embodiments, at most a portion of the light coupling structure is formed from the n-type or p-type semiconductor layer.

In some embodiments, the device further includes an electrode in electrical communication with the n-type or p-type semiconductor layer. In some cases, the electrode is recessed in the light coupling layer. The electrode may be disposed in an orifice (or cavity) formed in the light coupling layer. In an embodiment, the electrode is in contact (or electrical contact) with the n-type or p-type semiconductor layer.

In some embodiments, the light coupling structure (or light coupling layer) couples light from a first medium having a first refractive index to a second having a second refractive index. The first and second refractive indexes may be different. In some cases, the second refractive index is less than the first refractive index.

During the operation of the light emitting device, at least some of the light generated in the active layer is directed towards the light coupling structure, which scatters light at various angles, at least some of which may be directed out of the light emitting device. The light coupling structure may aid in directing light generated by the active layer of the device.

In some embodiments, the light emitting device has an external quantum efficiency of at least about 40%, or at least about 50%, or at least about 60%, or at least about 65%, or at least about 70%, or at least about 75%, or at least about 80%, or at least about 85%, or at least about 90%, or at least about 95% at a drive current of about 350 mA.

In some situations, the light coupling structure has a corrugated or roughened surface. In some embodiments, the light coupling structure has a first surface (e.g., top surface) opposite from a second surface (e.g., bottom surface). The first surface has a corrugation that is greater than the corrugation of the second surface. The first surface may be in contact with the external environment, such as air or a vacuum, or in contact with one or more layers, such as protective layers.

The n-type and/or p-type semiconductor layers may be formed of a Group III-V semiconductor material, such as gallium nitride. The substrate may be formed of silicon. In embodiments, the thickness of the n-type semiconductor layer is selected to minimize the stress imposed by the lattice mismatch and thermal mismatch between the silicon substrate and the Group III-V semiconductor. In other cases, however, such as when device formation under induced stress conditions is desired, the thickness of the n-type semiconductor layer is selected to maintain a predetermined level of stress.

In some embodiments, a light emitting device includes a first layer of a first type of Group III-V semiconductor material and a second layer of a second type of Group III-V semiconductor material, and an active layer between the first layer and the second layer. The light emitting device has a light coupling layer adjacent to the second layer. The light coupling layer includes a third type of Group III-V semiconductor material. In some situations, the third type of Group III-V semiconductor material is different from the first type of Group III-V semiconductor material and the second type of Group III-V semiconductor material. An orifice (or cavity) formed in the light coupling layer extends through at least a portion of the light coupling layer towards the second layer. In some situations, the orifice extends through all or substantially all of the light coupling layer. An electrode formed in the orifice provides an electrical flow path to the second layer.

In some embodiments, the orifice defines a channel in the light coupling layer. The channel extends along some or all of the light coupling layer. The electrode in such a case is formed in the channel and in electrical communication with the second layer.

In some situations, the first type of Group III-V semiconductor material is selected from one of an n-type Group III-V semiconductor and a p-type Group III-V semiconductor, and the second type of Group III-V semiconductor material is selected from the other of the n-type Group III-V semiconductor and the p-type Group III-V semiconductor. In an example, the first layer is formed of p-GaN and the second layer is formed of n-GaN. In some cases, the third type of Group III-V semiconductor material includes a u-type Group III-V semiconductor material, a doped Group III-V semiconductor material, and/or an aluminum-containing Group III-V semiconductor material. In an example, the third type of Group III-V semiconductor material includes u-GaN (i.e., undoped or unintentionally doped GaN). In another example, the third type of Group III-V semiconductor material includes n-GaN or p-GaN. In another example, the third type of Group III-V semiconductor material includes AlGaN or AlN.

In some cases, at most a portion of a light coupling layer is formed from an n-type or p-type Group III-V semiconductor layer adjacent to the light coupling layer. In an example, an LED includes a substrate and a first layer adjacent to the substrate. The first layer includes one of a p-type Group III-V semiconductor and an n-type Group III-V semiconductor. The LED includes a second layer adjacent to the first layer. The second layer includes an active material configured to generate light upon the application of a forward-biasing electrical potential across the second layer. The LED further includes a third layer adjacent to the second layer. The third layer includes the other of the p-type Group III-V semiconductor and the n-type Group III-V semiconductor. A light coupling structure is disposed adjacent to the third layer. The light coupling structure includes one or more Group III-V semiconductor materials, such as one or more layers of Group III-V semiconductor materials. At most a portion of the light coupling structure is formed from the third layer. In an embodiment, some of the light coupling structure is formed from the third layer. In another embodiment, the light coupling structure is not formed from the third layer.

The LED further includes an electrode formed adjacent to the third layer. The electrode is in electrical communication with the third layer. In some cases, the first layer has a p-type Group III-V semiconductor (e.g., p-GaN) and the third layer has an n-type Group III-V semiconductor (e.g., n-GaN).

The light coupling structure includes a fourth layer and a fifth layer, with the fourth layer being adjacent to the third layer of the LED. In some embodiments, the fourth layer includes one or more of an n-type Group III-V semiconductor, u-type Group III-V semiconductor and an aluminum-containing Group III-V semiconductor. In some cases, the fourth layer includes one or more of n-type gallium nitride, u-type gallium nitride, aluminum gallium nitride and aluminum nitride. In some embodiments, the fifth layer includes one or more of a u-type Group III-V semiconductor and an aluminum-containing Group III-V semiconductor. In some cases, the fifth layer includes one or more of u-type gallium nitride, aluminum gallium nitride and aluminum nitride. In an example, the fourth layer includes one or more of n-GaN, u-GaN, AlGaN and AlN, and the fifth layer includes one or more of u-GaN, AlGaN and AlN.

In some embodiments, the light coupling structure of the LED includes a sixth layer adjacent to the fifth layer. In such a case, the fifth layer is between the fourth and sixth layers. In some embodiments, the sixth layer includes an aluminum-containing Group III-V semiconductor. In some cases, the aluminum-containing Group III-V semiconductor is aluminum gallium nitride or aluminum nitride.

The light coupling structure includes an orifice extending across the light coupling layer to the third layer. The orifice traverses the various layers of the light coupling structure, such as the fourth and fifth layers.

In an example, the light emitting device includes a silicon substrate, a p-GaN layer over the silicon substrate, an active layer over the p-GaN layer, an n-GaN layer over the active layer, and a light coupling layer over the n-GaN layer. The light coupling layer includes AlGaN and/or AlN, and in some cases u-GaN. The light coupling layer in some situations includes n-GaN. For instance, the light coupling layer may include an n-GaN sub-layer adjacent to the n-GaN layer, a u-GaN sub-layer over the n-GaN sub-layer, and an AlGaN or AlN sub-layer over the u-GaN sub-layer. As another example, the light coupling layer may include an n-GaN sub-layer adjacent the n-GaN layer and an AlGaN or AlN sub-layer over the n-GaN sub-layer. The light coupling layer includes an orifice extending to the n-GaN layer. The device includes an electrode formed in the orifice and in electrical contact with the n-GaN layer. The electrical contact in some situations is an ohmic contact.

The orifice of the light coupling layer may be a channel extending from a top surface of the light coupling layer through at least a portion of the light coupling layer. The channel also extends along a surface of the light coupling layer. In some cases, an electrode formed in the orifice is a line extending along at least a portion or substantially all of the orifice. The electrode is laterally bounded by the light coupling layer. In some situations, the electrode is recessed in the light coupling layer. Alternatively, the orifice of the light coupling layer is a via (or through hole) extending from the top surface of the light coupling layer through at least a portion of the light coupling layer. In some cases, the orifice extends through all or a substantial portion of the light coupling layer.

In some embodiments, n-type and p-type semiconductor layers are formed of a Group III-V semiconductor material. In an example, n-type and p-type semiconductor layers include gallium nitride. In such a case, the n-type semiconductor layer includes gallium nitride and an n-type dopant, such as, e.g., silicon, and the p-type semiconductor layer includes gallium nitride and a p-type dopant, such as, e.g., magnesium.

In some embodiments, light coupling structures are formed of various combinations of Group III-V materials. In some embodiments, a light coupling structure includes a first layer (or sub-layer) and a second layer adjacent to the first layer. In an example, the first layer includes u-type GaN (u-GaN) and the second layer includes aluminum gallium nitride (AlGaN) or aluminum nitride (AlN).

In another example, the first layer includes AlGaN and the second layer includes AlN. At least a portion of the light coupling layer may be formed of the n-type semiconductor layer. In another example, the first layer is formed of n-GaN and the second layer is formed of u-GaN, AlGaN or AlN. In some cases, the light coupling layer includes a third layer of a semiconductor material adjacent to the second layer. In an example, the third layer includes a Group III-V semiconductor material, such as AlGaN or AlN.

The light emitting device includes a first electrode in electrical communication with the n-type semiconductor layer and a second electrode in electrical communication with the p-type semiconductor layer. In some cases, the first electrode is adjacent to the light coupling layer and the second electrode is adjacent to the substrate. The first electrode may include one or more of titanium, aluminum, nickel, platinum, gold, silver, rhodium, copper and chromium. The second electrode may include one or more of aluminum, titanium, chromium, platinum, nickel, gold, rhodium and silver. In some cases, the second electrode is formed of one or more of platinum, nickel, silver, rhodium and gold.

In some embodiments, the first electrode covers a portion of the n-type semiconductor layer. The shape and distribution of the first electrode may be selected to minimize the obstruction of light emanating from the light emitting device by the first electrode. In some cases, the first electrode is recessed in the light coupling layer.

The light coupling layer (or structure), in some cases, is a roughened layer, such as, e.g., a roughened layer of a buffer material. In an embodiment, the light coupling layer has a thickness between about 10 nm and 3 microns, or between about 100 nm and 2 microns, or between about 200 nm and 1.5 microns. In another embodiment, the bottom portion (or floor) of the orifice may have a corrugation that is between about 1 nm and 500 nm, or between about 10 nm and 100 nm.

In some embodiments, the light coupling layer is a roughened layer. The roughened layer in some cases has protrusions. In some embodiments, the light coupling layer has a roughness (or corrugation) that is between about 10 nanometers (nm) and 3 micrometers ("microns"), or between about 100 nm and 2 microns, or between about 200 nm and 1.5 microns. In other embodiments, the light coupling layer has a corrugation that is greater than or equal to about 10 nm, or greater than or equal to about 50 nm, or greater than or equal to about 100 nm, or greater than or equal to about 200 nm, or greater than or equal to about 300 nm, or greater than or equal to about 400 nm, or greater than or equal to about 500 nm, or greater than or equal to about 1000 nm.

In some embodiments, the light coupling layer has protrusions that have sizes (e.g., heights) between about 10 nanometers (nm) and 3 micrometers ("microns"), or between about 100 nm and 2 microns, or between about 200 nm and 1.5 microns. In other embodiments, the light coupling layer has protrusions that have sizes greater than or equal to about 10 nm, or greater than or equal to about 50 nm, or greater than or equal to about 100 nm, or greater than or equal to about 200 nm, or greater than or equal to about 300 nm, or greater than or equal to about 400 nm, or greater than or equal to about 500 nm, or greater than or equal to about 1000 nm.

The orifice (or cavity) exposes a portion of the light coupling layer or a layer below the light coupling layer, such as the n-type semiconductor layer. In some cases, the exposed portion has a corrugation that is less than the corrugation of the light coupling layer. In some embodiments, the exposed portion has a corrugation that is less than or equal to about 500 nanometers (nm), or less than or equal to about 300 nm, or less than or equal to about 200 nm, or less than or equal to about 100 nm. The exposed portion may have a corrugation that is between about 1 nm and 500 nm, or between about 10 nm and 100 nm.

The corrugation, or surface roughness, of the light coupling layer and a recessed surface of the orifice (i.e., bottom portion of the orifice) may be measured with the aid of various surface spectroscopic tools, such as scanning tunneling microscopy (STM), atomic force microscopy (AFM) or various surface scattering techniques, such as Raman spectroscopy. The corrugation may correspond to the height (e.g., pit-to-peak distance) of a moiety of the light coupling layer.

In some cases, the orifice includes one or more sidewalls and a floor. In some situations, the orifice is box-like or rectangular. In other cases, the orifice is semi-circular or semi-elliptical. In such cases, the orifice may not have a floor. The orifice may be a line having a first dimension (along a surface of the light coupling layer) that is longer than a second dimension perpendicular to the first dimension. Alternatively, the first and second dimensions may be substantially the same. The orifice in such a case may be a via-type structure.

In some cases, the light coupling layer includes one or more light coupling moieties disposed at a surface of the light coupling layer. In some embodiments, the light coupling moieties are protrusions. The light coupling moieties may be formed of a diffuse optically transmitting material. In some embodiments, an individual moiety of the light coupling moieties may be two-dimensional or three-dimensional, such as a three-dimensional cone or horn, or a line having a two-dimensional geometric cross-section. An individual light coupling moiety may have a decreasing width along an axis oriented away from the active layer. In an embodiment, an individual light coupling moiety has a triangular cross-section. In another embodiment, an individual light coupling moiety is pyramidal or substantially pyramidal. In other cases, an individual light coupling moiety has a substantially constant width along an axis oriented away from the active layer. In an embodiment, an individual light coupling moiety has a cross-section that is square or rectangular. In an example, an individual light coupling moiety is rod-like. The corrugation at the surface of the light coupling layer may be selected to optimize the coupling of light from a first medium to a second medium. The first medium may be internal to the light emitting device and the second medium may be external to the light emitting device.

In some embodiments, the substrate includes one or more of silicon, germanium, silicon oxide, silicon dioxide, titanium oxide, titanium dioxide and sapphire, silicon carbide, alumina, aluminum nitride, copper, tungsten, molybdenum, and combinations thereof. In a particular implementation, the substrate is silicon, such as, e.g., p-type silicon.

In some situations, the light emitting device further includes an optical reflector between the substrate and the p-type semiconductor layer. The optical reflector may be formed of one or more of silver, platinum, gold and nickel, rhodium and indium.

In some embodiments, the active layer includes an active material having a Group III-V semiconductor. In some cases, the active material is a quantum well active material, such as a multiple quantum well (MQW) material. In an embodiment, the active layer includes alternating well layers (or sub-layers) and barrier (or cladding) layers. In an example, the active layer includes a well layer formed of indium gallium nitride and/or indium aluminum gallium nitride. In such a case, the barrier layer may be formed of gallium nitride. In another example, the active layer includes a well layer formed of aluminum gallium nitride. In such a case, the barrier layer may be formed of aluminum nitride or gallium nitride. The active material of the active layer may be compositionally graded (also "graded" herein) in two or more elements. In an example, the active layer includes graded indium gallium nitride, $In_xGa_{1-x}N$, wherein 'x' is a number between 0 and 1, and a barrier (or cladding) layer formed of GaN. The composition of such a layer may vary from a first side to a second side of the active layer. In some situations, a well layer includes an acceptor material and/or a barrier layer includes a donor material. In some embodiments, barrier materials include one or more of gallium nitride, indium gallium nitride and aluminum nitride, and well materials include one or more of indium gallium nitride, indium aluminum gallium nitride.

As an alternative, the active layer is formed of AlGaInP. In some cases, an AlGaInP-containing quantum well active layer includes one or more well layers formed of AlGaInP and one or more barrier layers formed of AlInP.

In other embodiments, a light emitting device includes a light coupling structure adjacent to a p-type semiconductor layer. In an example, a light emitting device includes a substrate, a first layer having an n-type Group III-V semiconductor adjacent to the substrate, an active layer adjacent to the first layer, a second layer having a p-type Group III-V semiconductor adjacent to the active layer, and a light coupling structure adjacent to the second layer. The n-type and p-type Group III-V semiconductors may be formed of gallium nitride. The substrate may be formed of silicon. The light coupling structure may include a single layer or a plurality of layers.

The light coupling structure includes an orifice extending at least partly through the light coupling structure. In some situations, the orifice (e.g., channel) extends through all of the light coupling structure. The light emitting device includes a first electrode in electrical communication with the second layer, such as by direct contact with the second layer or by way of a doped layer between the electrode and the second layer. The orifice in other cases extends through the light coupling structure to a top surface of the second layer. The orifice in such a case is defined in part by the top surface of the second layer. The light emitting device includes a second electrode in electrical communication with the first layer.

Figure 2:
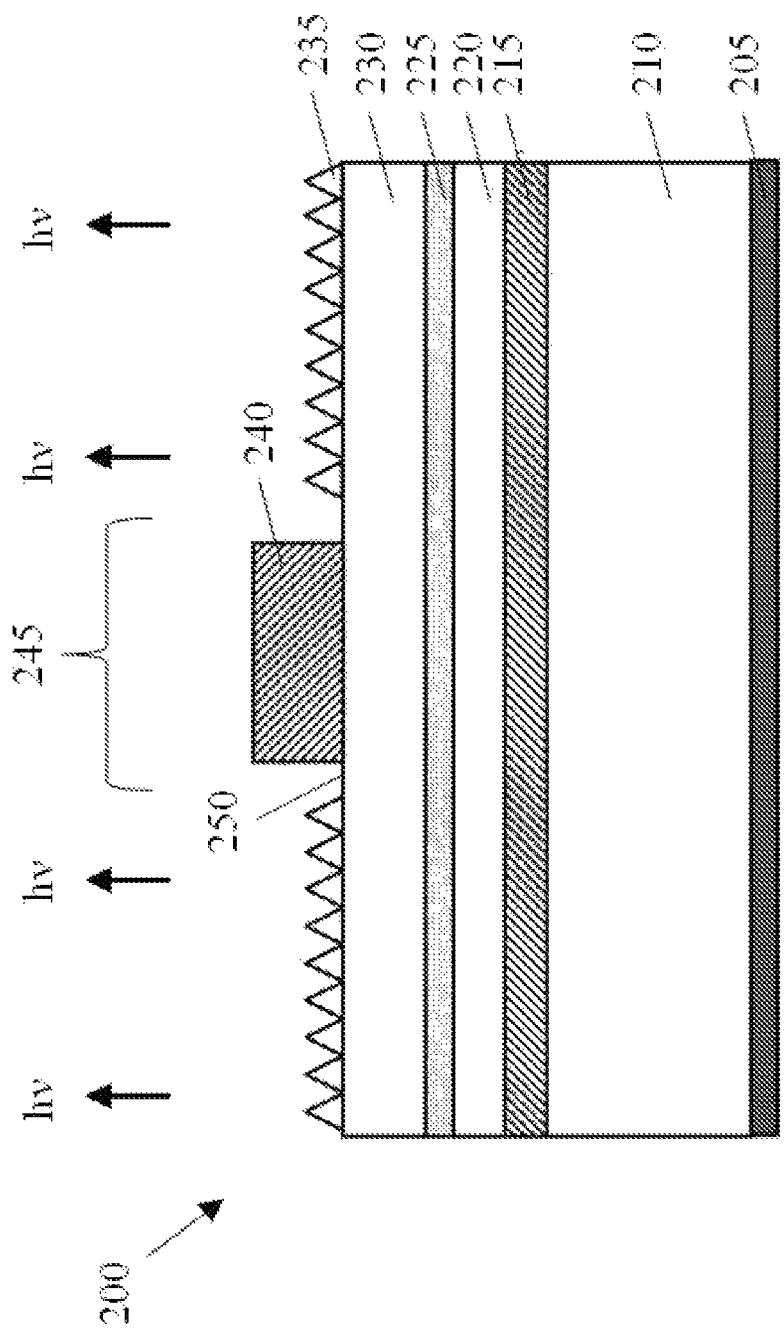
FIG. 2 schematically illustrates a light emitting device having a light coupling layer, in accordance with an embodiment of the invention.

FIG. 2 shows a light emitting device 200, in accordance with an embodiment of the invention. The device 200 may be a light emitting diode (LED), such as a vertically stacked LED. The device 200 includes, from bottom to top, a bottom electrode 205, a substrate 210, an optically reflective layer 215, a p-type semiconductor layer 220, an active layer 225, an n-type semiconductor layer 230, a light coupling layer 235, and a top electrode 240. The arrows in the device 200 indicate the direction of the flow of current upon the application of an electrical potential across the electrodes 205 and 240. The top electrode 240 is formed in an orifice 245 formed in the light coupling layer 235. The electrode 240 is in contact with the n-type semiconductor layer 230 at a surface 250 of the n-type semiconductor layer 230.

The active layer 225 may be a quantum well active layer having a well layer and a barrier layer, or a multiple quantum well (MQW) active layer having a plurality of well layers and barrier layers. In an example, the active layer 225 is formed of alternating GaN barrier layers and indium gallium nitride or aluminum indium gallium nitride well layers. The active layer 225 is configured to generate light upon the recombination of electrons and holes in the active layer 225.

The light coupling layer 235 is configured to couple light generated in the device 200 and emanating from the n-type semiconductor layer 230 to an environment outside the device 200 or to another layer over the light coupling layer 235. In an embodiment, the light coupling layer 235 facilitates the transmission of light from the n-type semiconductor 230 layer having a first refractive index to a material or environment having a second refractive index that is lower than the first refractive index.

The optically reflective layer 215 is formed of a material configured to reflect light generated in the active layer 225 towards the light coupling layer 235. With the aid of the optically reflective layer 215, light that is initially generated in the active layer 225 and directed toward the substrate 210 is reflected by the optically reflective layer 215 towards the active layer 225 and the light coupling layer 235. In some cases, the optically reflective layer 215 is formed of a reflective p-type electrode. In other cases, the optically reflective layer is formed of silver, platinum, gold, nickel, aluminum, rhodium and indium. In some situations, the optically reflective layer 215 is an omnidirectional reflector The device 200 may include one or more additional layers. For instance, the device 200 may include a pit generation layer between the n-type semiconductor layer 230 and the active layer 225 configured to facilitate the formation of V-pits (or V-defects) in the active layer 225. In an embodiment, the device 200 includes an electron blocking layer between the p-type semiconductor layer 220 and the active layer 225, which is configured to minimize electron-hole recombination in the p-type semiconductor layer 220.

In some situations, the n-type semiconductor layer 230 is formed of an n-type Group III-V semiconductor, such as n-type gallium nitride. In some cases, The p-type semiconductor layer 220 is formed of a p-type Group III-V semiconductor, such as p-type gallium nitride. In an example, the n-type semiconductor layer 230 is doped n-type with the aid of silicon. In another example, the p-type semiconductor layer 220 is doped p-type with the aid of magnesium.

In some embodiments, the light coupling layer 235 is formed of one or more semiconductor materials. In some situations, the light coupling layer 235 is formed of buffer layer material. The light coupling layer 235 may be compositionally graded between a first type of semiconductor material and a second type of semiconductor material, such as between a first type of Group III-V semiconductor and a second type of Group III-V semiconductor. Alternatively, the light coupling layer 235 includes one or more discrete layers that are not compositionally graded.

In some situations, the light coupling layer (or structure) 235 includes a plurality of sub-layers (or layers) having materials generally of the formula $M1_xM2_{1-x}C_y$, wherein 'M1' and 'M2' are Group III materials, and 'C' is a Group V material. In some cases, the light coupling layer 235 includes a plurality of layers selected from $Al_xGa_{1-x}N$, wherein 'x' is a number between 0 and 1. For instance, the light coupling layer 235 may include one or more materials selected from AlN, AlGaN and u-type GaN. In an example, the light coupling layer 235 includes a u-type GaN layer (i.e., a layer having u-GaN) and an AlGaN layer (i.e., a layer having AlGaN). In another example, the light coupling layer 235 includes a u-type GaN layer, an AlGaN layer, and an AlN layer (i.e., a layer having AlN). In another example, the light coupling layer 235 includes an n-GaN layer, an AlGaN layer and an AlN layer. In another example, the light coupling layer 235 includes an n-GaN layer and an AlGaN layer. The light coupling layer 235 may also include an AlN layer. In another example, the light coupling layer 235 includes a u-GaN layer and an AlGaN layer. The light coupling layer 235 may also include an AlN layer. The u-GaN layer in some cases is optional.

In some situations, the light coupling layer 235 is formed of a u-type semiconductor material. In an embodiment, the light coupling layer 235 is formed of a u-type Group III-V semiconductor, such as u-type gallium nitride (u-GaN). The light coupling layer 235 may include a layer of a semiconductor material, such as a Group III-V semiconductor material (e.g., AlGaN), over the u-type semiconductor material. In some embodiments, the light coupling layer 235 includes a layer of an n-type semiconductor material (e.g., n-GaN) and a layer of the u-type semiconductor material. The layer of the n-type semiconductor material may be formed from a portion of the n-type Group III-V semiconductor layer 230.

In some situations, the light coupling layer 235 is formed from an aluminum-containing Group III-V semiconductor material (e.g., AlGaN). In some situations, the light coupling layer 235 includes an additional layer of a Group III-V semiconductor. In an example, the light coupling layer includes a layer of AlGaN and a layer of AlN. The layer of AlGaN is disposed adjacent to the n-type semiconductor layer 230. In some embodiments, the light coupling layer 235 includes a layer of an n-type semiconductor material and one or more aluminum-containing layers adjacent to the layer of the n-type semiconductor material, such as an AlGaN layer and/or an AlN layer. The layer of the n-type semiconductor material, in some cases, is formed from a portion of the n-type Group III-V semiconductor layer 230. The light coupling layer 235 may include a layer of a u-type Group III-V semiconductor, such as u-GaN, between the n-type semiconductor layer 230 and the one or more aluminum-containing layers.

The bottom electrode 205 is formed adjacent to the substrate 210. The bottom electrode 205 is in electrical communication with the p-type semiconductor layer 220 through the substrate and the optically reflective layer 215. In some situations, the device 200 includes one or more additional layers between the bottom electrode 205 and the substrate 210.

The top electrode 240 is formed in the orifice 245. The top electrode 240 is in electrical communication with the n-type semiconductor layer 230. As illustrated, the top electrode 240 is in contact with the n-type semiconductor layer 230. The contact in some cases is an ohmic contact. In some situations, the device 200 includes one or more additional layers between the top electrode 240 and the n-type semiconductor layer 230.

Alternatively, the p-type semiconductor layer 220 and the n-type semiconductor layer 230 are reversed. That is, the light coupling layer 235 is adjacent to the p-type semiconductor layer and the n-type semiconductor layer is disposed between the substrate 210 and the active layer 225.

Figure 3:
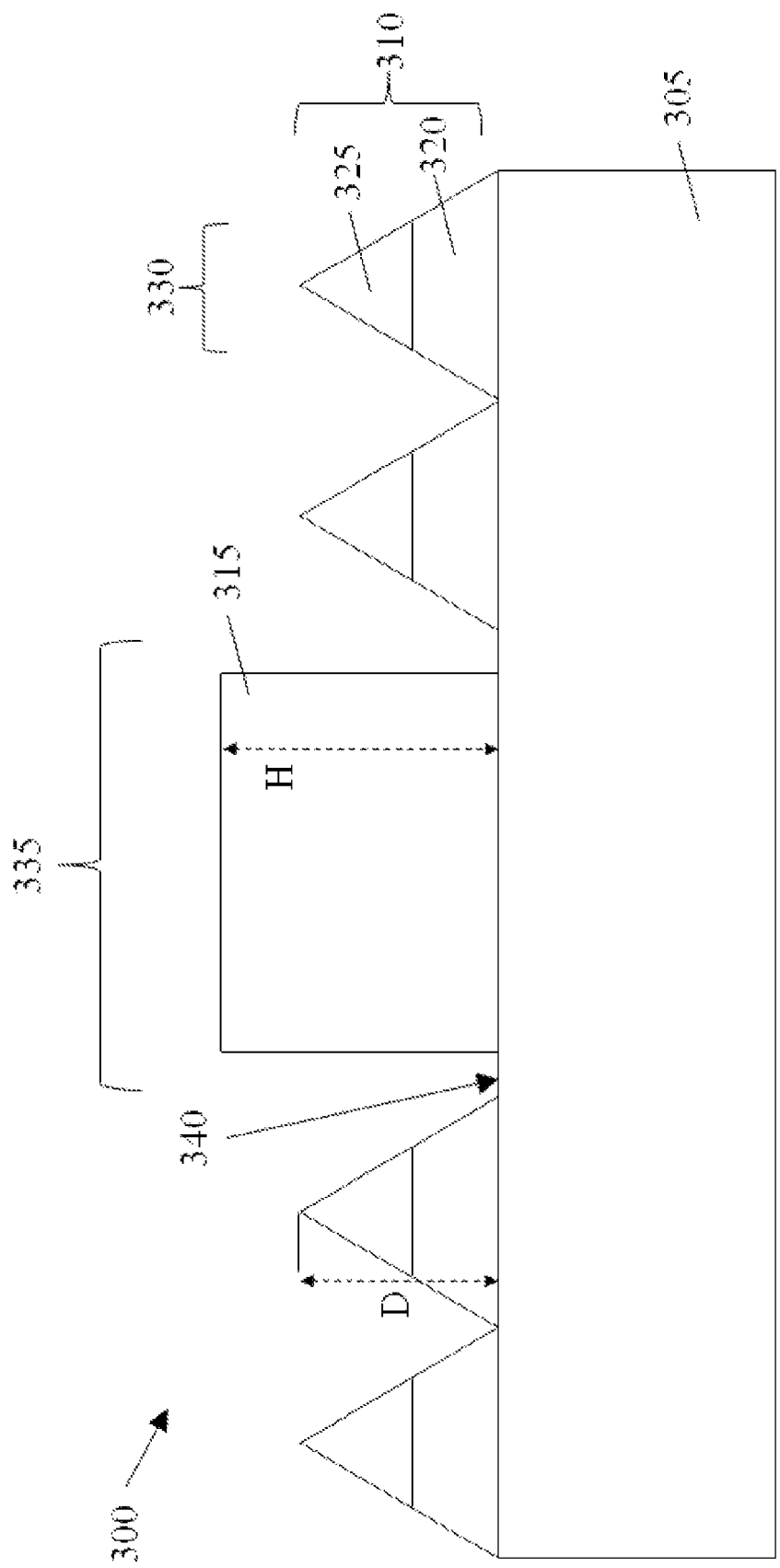
FIG. 3 schematically illustrates a light emitting device having a light coupling structure, in accordance with an embodiment of the invention.

FIG. 3 shows a light emitting device 300, in accordance with an embodiment of the invention. The device 300 includes, from bottom to top, a semiconductor layer 305, a light coupling layer (or structure) 310 and an electrode 315. The light coupling layer 310 includes a first layer (or sub-layer) 320 and a second layer (or sub-layer) 325. The light coupling layer 310 includes light coupling moieties 330. The electrode 315 is formed in a cavity (or opening) 335 of the light coupling layer 310. The electrode 315 is in contact with the semiconductor layer 305.

In an embodiment, the semiconductor layer 305 is formed of an n-type semiconductor. In another embodiment, the semiconductor layer 305 is formed of a p-type semiconductor. In some cases, the semiconductor layer 305 is formed of an n-type or p-type Group III-V semiconductor. In an example, the semiconductor layer 305 is formed of n-GaN.

The first layer 320 is formed of a semiconductor material. In some situations, the first layer is formed of an n-type or p-type semiconductor material. The first layer 320 may be formed of a Group III-V semiconductor. As an example, the first layer is formed of n-GaN. As another example, the first layer 320 is formed of u-type GaN. As another example, the first layer 320 is formed of p-GaN. As another example, the first layer 320 is formed of an aluminum-containing Group III-V semiconductor material, such as AlGaN. In an embodiment, the first layer 320 is formed of a portion of the semiconductor layer 305.

In some embodiments, the second layer 325 is formed of a semiconductor material. In some situations, the second layer 325 is formed of a Group III-V semiconductor. In an example, the second layer 325 is formed of gallium nitride, such as u-type GaN. In another example, the second layer 325 is formed of an aluminum-containing Group III-V semiconductor, such as aluminum gallium nitride or aluminum nitride.

The light coupling structure 310 may include a third layer adjacent to the second layer 325. The third layer may include a Group III-V semiconductor, such as an aluminum-containing Group III-V semiconductor (e.g., AlGaN or AlN).

The electrode 315 is formed of one or more elemental metals. In some embodiments, the electrode 315 is formed of one or more of titanium, aluminum, nickel, platinum, gold, silver, rhodium, copper and chromium.

In some embodiments, the first layer 320 is formed of a first type of Group III-V semiconductor and the second layer 325 is formed of a second type of Group III-V semiconductor.

In some situations, the light coupling layer 310 is formed of a single layer of a Group III-V semiconductor, such as a single layer of a u-type Group III-V semiconductor, an n-type or p-type Group III-V semiconductor, or an aluminum-containing Group III-V semiconductor.

In an example, the first layer 320 is formed of u-GaN and the second layer 325 is formed of AlGaN or AlN. In some cases, the light coupling layer 310 includes a third layer over the second layer 325. The third layer may be formed of AlGaN or AlN. As another example, the first layer 320 is formed of n-GaN (e.g., silicon-doped GaN) and the second layer 325 is formed of u-GaN, AlGaN or AlN. Such a configuration may be used in cases in which the semiconductor layer 305 is formed of n-GaN, such as silicon doped GaN. As another example, the first layer 320 is formed of n-GaN and the second layer 325 is formed of AlGaN, and the third layer (not shown) is formed of AlN. As another example, the first layer 320 is formed of n-GaN; the second layer 325 is formed of one of u-GaN, AlGaN and AlN; and the third layer is formed of the other of u-GaN, AlGaN and AlN. As another example, the light coupling layer 310 is formed of a single layer having u-GaN, AlGaN or AlN.

In some situations, the light coupling layer 310 is formed of a buffer layer material used to form the device 300. The buffer layer material, in some cases, includes one or more Group III-V semiconductor materials, such as one or more of u-GaN, AlGaN and AlN. The light coupling layer 310 may be formed by roughening a buffer layer from previous processing operations (see below).

The light coupling layer 310 may be formed of 1, or 2, or 3, or 4, or 5, or 6, or 7, or 8, or 9, or 10, or more layers. For example, the light coupling layer 310 includes a u-GaN, aluminum gallium nitride (AlGaN), or aluminum nitride (AlN) layer and no other layers. As another example, the light coupling layer 310 is formed of a u-GaN layer and an AlGaN (or AlN) layer. As another example, the light coupling layer 310 is formed of an n-GaN layer and a u-GaN, AlGaN or AlN layer. As another example, the light coupling layer 310 is formed of an AlGaN layer and an AlN layer. As another example, the light coupling layer 310 is formed of an n-GaN layer, an AlGaN layer and an AlN layer. The light coupling layer 310 may include an optional u-GaN layer.

In some embodiments, the light coupling moieties 330 are two-dimensional or three-dimensional. In some situations, the light coupling moieties 330 are lines (e.g., directed into the plane of the page) with triangular cross-sections. Alternatively, the light coupling moieties 330 may have square or rectangular cross-sections. In other situations, the light coupling moieties 330 are three-dimensional. In such a case, the light coupling moieties 330 may be cone-like or pyramidal. Alternatively, the light coupling moieties 330 may be rod-like.

In some embodiments, the device 300 includes one or more additional layers. In an example, the device 300 includes an active layer below the semiconductor layer 305, and another semiconductor layer 305 below the active layer. The active layer is configured to generate light upon the recombination of electrons and holes in the active layer. Some of the light generated in the active layer is directed toward the light coupling layer 310, which scatters light at various angles, at least some of which may be directed out of the device 300. The light coupling layer 310 may therefore increase the fraction of light generated by the device 300 that is directed out of the device.

In some embodiments, the light coupling layer 310 has a corrugation between about 10 nm and 3 microns, or between about 100 nm and 2 microns, or between about 200 nm and 1.5 microns. In some cases, the light coupling layer 310 has a corrugation that is less than 0.5 microns. The corrugation corresponds to the distance between the highest point of an individual moiety and the lowest point of the individual moiety, as illustrated by "D" in FIG. 3. The electrode 315 has a height (H) that is greater than D. In other cases, the electrode 315 has a height that is less than or equal to D.

The electrode 315 is disposed in the cavity (or orifice) 335 and in contact with the semiconductor layer 305 at the surface 340 of the semiconductor layer 305. Such a configuration provides an electric flow path from semiconductor layer 305 to the electrode 315. The contact between the electrode 315 and the semiconductor layer 305 may be ohmic, which helps maximize the extraction efficiency of electrons from the device 300.

In some embodiments, the bottom portion (or floor) 340 of the orifice 335 has a corrugation that is between about 1 nm and 500 nm, or between about 10 nm and 100 nm. In some cases, the corrugation of the bottom portion 340 is less than about 0.5 microns, or 0.1 microns, or 0.01 microns. The corrugation of the bottom portion 340 is smaller than the corrugation of the light coupling layer 310.

In some embodiments, the light coupling layer 310 couples light from a first medium having a first refractive index to a second medium having a second refractive index. In an embodiment, the light coupling layer 310 (including the light coupling moieties 330) couples light from a medium internal to the device 300, such as the semiconductor layer 305, to a medium above the light coupling layer 310 (such as, e.g., external to the device 300).

Figure 4:
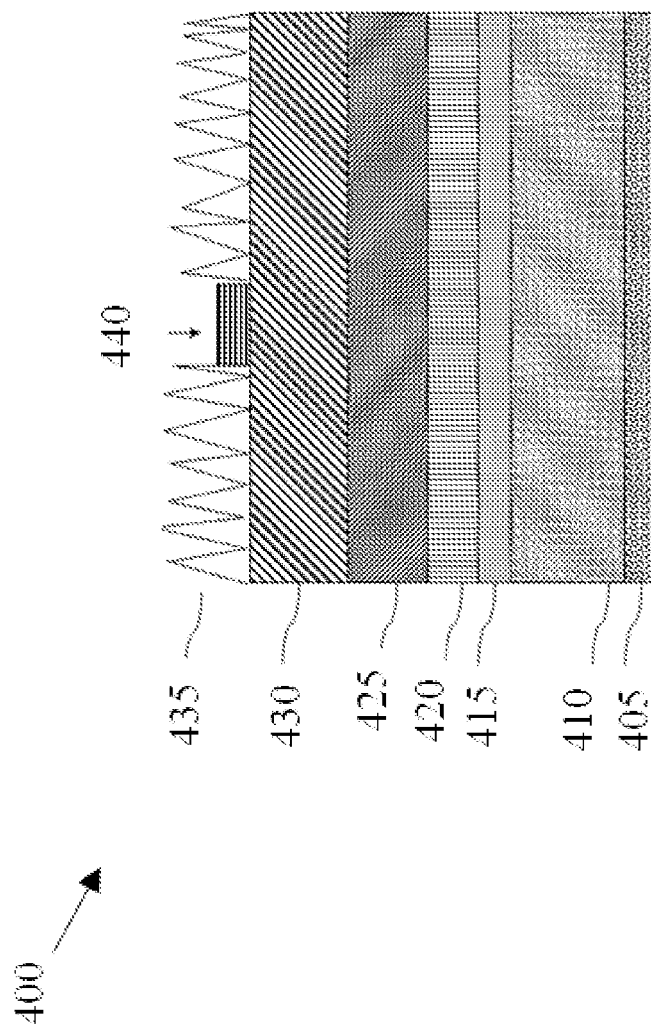
FIG. 4 schematically illustrates a light emitting device, in accordance with an embodiment of the invention.

In an example, a light emitting device includes a Group III-V semiconductor over a silicon substrate. FIG. 4 shows a light emitting device 400, having, from bottom to top, a contact layer 405, a substrate 410, a reflective layer 415, a p-type Group III-V semiconductor layer 420, an active layer 425, an n-type Group III-V semiconductor layer 430, a light coupling layer 435, and an electrode 440, in accordance with an embodiment of the invention. The contact layer 405 may be for providing an electrical contact between the device 400 and a package substrate, such as a transistor outline (TO) header or a metal core printed circuit board (MCPCB). The light coupling layer 435 includes a portion of the material of the n-type Group III-V semiconductor layer 430. In some cases, however, the light coupling layer 435 does not include a portion of the material of the n-type semiconductor layer 430. The electrode may be formed of a reflective n-type electrode. The electrode 440 is recessed in the light coupling layer 435. In some situations, the electrode 440 is formed in an orifice (or cavity) formed in the light coupling layer 435. The electrode 440 is in electrical communication with the n-type Group III-V semiconductor layer 430. In some cases, the electrode 440 is in ohmic contact with the n-type Group III-V semiconductor layer.

The substrate 410 may be formed of silicon, germanium, silicon oxide, silicon dioxide, titanium oxide, titanium dioxide or sapphire. In some cases, the substrate 410 is formed of silicon, germanium, or other semiconductor, a ceramic (e.g., $Al_2O_3$, aluminum nitride, magnesium oxide) material, or a metal (e.g., molybdenum, tungsten, copper, aluminum).

The reflective layer 415 is formed of a material configured to reflect light. In an embodiment, the reflective layer 415 is formed of silver.

The p-type Group III-V semiconductor layer 420, in some cases, is formed of p-type GaN. In an embodiment, p-type doping is achieved with the aid of magnesium, though other p-type dopants may be used as required to achieve desired device performance. The p-type Group III-V semiconductor layer 420 has a thickness between about 10 nanometers (nm) and 1000 nm, or between about 50 nm and 500 nm.

The active layer 425 may be a quantum well active layer. In some embodiments, the active layer 425 is a multiple quantum well active layer including a plurality of alternating well layers and barrier layers. In some situations, the active layer 425 includes GaN barrier layers and aluminum indium gallium nitride or indium gallium nitride well layers.

In some embodiments, the n-type Group III-V semiconductor layer 430 is formed of n-type GaN. In an embodiment, n-type doping is achieved with the aid of silicon, though other n-type dopants may be used as required to achieve desired device performance. The n-type Group III-V semiconductor layer 430 has a thickness between about 500 nm and 5 micrometers ("microns"), or between about 1 micron and 3 microns. In some cases, the n-type Group III-V semiconductor layer 430 has a thickness less than or equal to about 5 microns, or less than or equal to about 4 microns, or less than or equal to about 3 microns, or less than or equal to about 2 microns, or less than or equal to about 1 micron.

In some embodiments, the light coupling layer 435 has a corrugation between about 10 nm and 3 microns, or between about 100 nm and 2 microns, or between about 200 nm and 1.5 microns. The corrugation may be selected to achieve desired device performance. The electrode 440 is disposed on a surface of the n-type Group III-V semiconductor layer 430. The corrugation of the surface is between about 1 nm and 500 nm, or between about 10 nm and 100 nm.

In some situations, the contact layer 405 is in electrical communication with the substrate 410 and the p-type Group III-V semiconductor layer 420. The contact layer 405 may be in ohmic contact with the substrate 410. The device 400 includes another electrode that is in electrical communication with the n-type Group III-V semiconductor layer 430. The other electrode may be provided through a hole or via extending from a top surface (at or adjacent to the light coupling layer 435) to the n-type group III-V semiconductor layer 430.

The light coupling layer 435, as illustrated, is formed of a layer of aluminum gallium nitride or aluminum nitride. In some situations, the light coupling layer 435 includes a u-GaN layer in addition to an AlGaN or AlN layer. In some cases, the light coupling layer 435 includes a u-GaN layer between the n-type Group III-V semiconductor layer 430 and the AlGaN or AlN layer.

In an example, the light coupling layer 435 is formed of an AlGaN layer. In another example, the light coupling layer 435 is formed of an AlN layer. In another example, the light coupling layer 435 is formed of an AlGaN layer over the n-type Group III-V semiconductor layer 430 and an AlN layer over the AlGaN layer. In another example, the light coupling layer 435 is formed of a u-GaN layer over the n-type Group III-V semiconductor layer 430 and an AlGaN layer over the u-GaN layer. In such a case, the light coupling layer 435 may include an AlN layer over the AlGaN layer.

Methods for Forming Light Coupling Layers

In another aspect of the invention, methods for forming light coupling layers (or structures) are provided. Methods provided herein may be used to form light coupling devices for use with light emitting devices, such as light emitting diodes (LED's). In a particular implementation, methods provided herein are used to form light coupling layers for use with LED's having Group III-V semiconductors on silicon substrates.

In some embodiments, a method for forming a light emitting device includes providing a substrate in a reaction chamber and forming one or more device layers on the substrate. In some situations, the light emitting device is formed on a substrate that will be included in the end product light emitting device. In other situations, the substrate is a carrier substrate, and a stack of device structures formed on the substrate will be transferred to another substrate that will be included in the end product. The carrier substrate in such a case will not be included in the end product. In some embodiments, the substrate includes one or more of silicon, germanium, silicon oxide, silicon dioxide, titanium oxide, titanium dioxide, SiC and sapphire. In a particular implementation, the substrate is silicon, such as n-type silicon.

The reaction chamber may be a vacuum chamber configured for thin film formation. The vacuum chamber, in some cases, is an ultrahigh vacuum (UHV) chamber. In cases in which a low-pressure environment is desired, the reaction chamber may be pumped with the aid of a pumping system having one or more vacuum pumps, such as one or more of a turbomolecular ("turbo") pump and a diffusion pump and a mechanical pump. The reaction chamber may include a control system for regulating precursor flow rates, substrate temperature, chamber pressure, and the evacuation of the chamber.

Growth conditions are adjustable based upon the selection of one or more process parameters for forming the light emitting device. In some embodiments, growth conditions are selected from one or more of growth temperature, carrier gas flow rate, precursor flow rate, growth rate and growth pressure.

Various source gases (or precursors) may be used with methods described herein. A gallium precursor may include one or more of trimethylgallium (TMG), triethylgallium, diethylgallium chloride and coordinated gallium hydride compounds (e.g., dimethylgallium hydride). An aluminum precursor may include one or more of tri-isobutyl aluminum (TIBAL), trimethyl aluminum (TMA), triethyl aluminum (TEA), and dimethylaluminum hydride (DMAH). An indium precursor may include one or more of trimethyl indium (TMI) and triethyl indium (TEI). A nitrogen precursor may include one or more of ammonia ($NH_3$), nitrogen ($N_2$), and plasma-excited species of ammonia and/or $N_2$. A p-type dopant precursor may include one or more of a boron precursor (e.g., $B_2H_6$), a magnesium precursor (e.g., biscyclopentadienyl magnesium), an aluminum precursor, to name a few examples. An n-type precursor may include one or more of a silicon precursor (e.g, $SiH_4$), a germanium precursor (e.g., tetramethylgermanium, tetraethylgermanium, dimethyl amino germanium tetrachloride, isobutylgermane) and a phosphorous precursor (e.g., $PH_3$), to name a few examples.

In some cases, one or more precursor are provided to a reaction chamber with the aid of a carrier gas including one or more of He, Ar, $N_2$ and $H_2$. In an embodiment, the flow rate of the carrier gas during the formation of the active layer is between about 1 liter/minute and 20 liters/minute.

Figure 5:
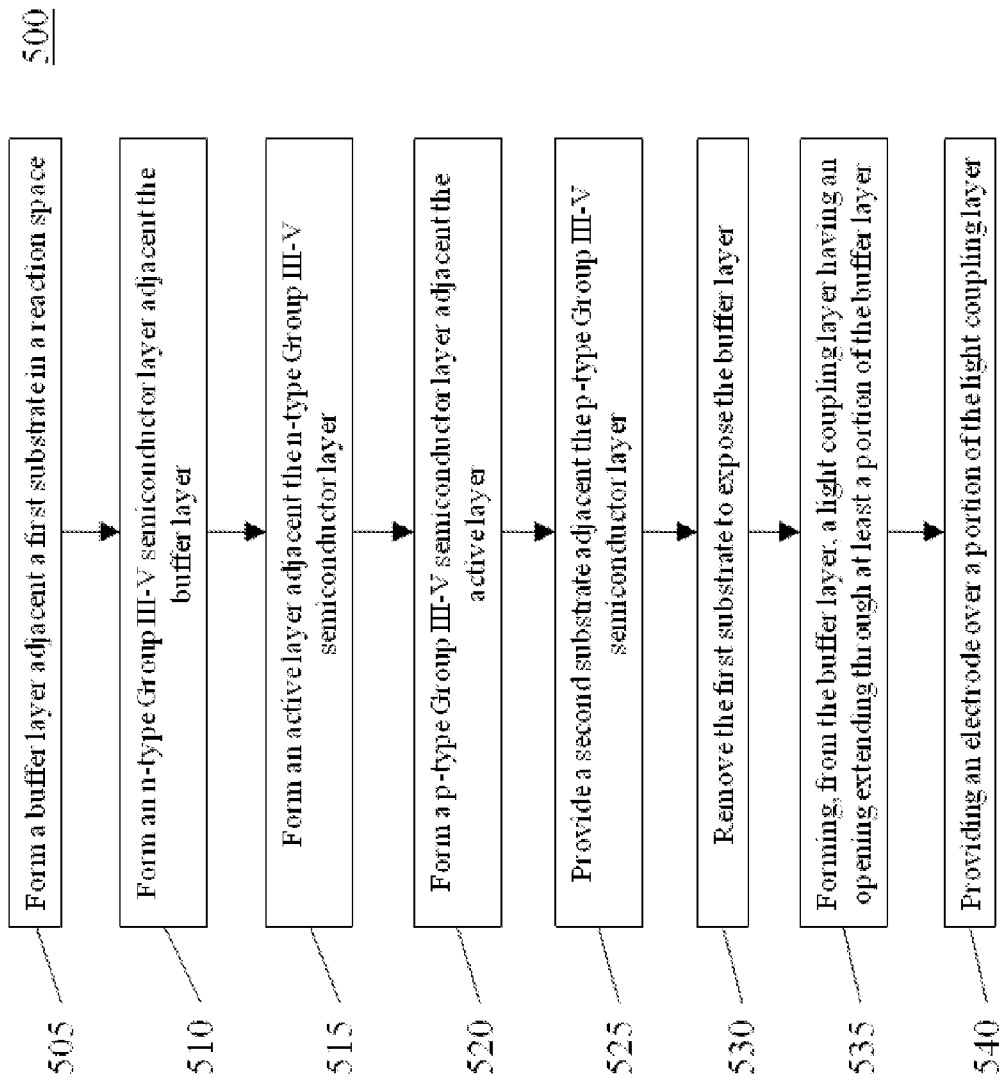
FIG. 5 shows a method for forming a light emitting device, in accordance with an embodiment of the invention.

FIG. 5 shows a method 500 for forming a light emitting device, in accordance with some embodiments of the invention. In some cases, the first substrate is selected from silicon, germanium, silicon oxide, silicon dioxide, titanium oxide, titanium dioxide, sapphire, silicon carbide (SiC), a ceramic material (e.g., alumina, AlN) and a metallic material (e.g., molybdenum, tungsten, copper, aluminum). In an implementation, the first substrate is silicon.

In a first operation 505, with the first substrate provided in the reaction chamber, a buffer layer is formed adjacent to the first substrate. The buffer layer is formed by directing into the reaction chamber one or more precursors of the buffer layer and exposing the substrate to the one or more precursors. In some embodiments, the buffer layer is formed of a Group III-V semiconductor material. In some situations, the buffer layer is formed of a stack having an AlGaN layer and an AlN layer, with the AlN layer being directly adjacent to the first substrate. In such a case, the AlN layer is formed by directing into the reaction chamber an aluminum precursor and a nitrogen precursor, and the AlGaN layer is formed by directing into the reaction chamber an aluminum precursor, a gallium precursor and a nitrogen precursor. The aluminum precursor may be TMA, the gallium precursor may be TMG, and the nitrogen precursor may be $NH_3$. In some cases, the buffer layer includes a u-GaN layer adjacent to the AlGaN layer. The u-GaN layer may be formed by directing into the reaction chamber a gallium precursor and a nitrogen precursor.

Next, in operation 510, an n-type Group III-V semiconductor layer is formed adjacent to the buffer layer. The n-type Group III-V semiconductor layer is formed by directing a Group III precursor, a Group V precursor and the precursor of an n-type dopant into the reaction chamber. In an example, with the n-type Group III-V semiconductor layer including n-GaN, the n-GaN layer is formed by directing a gallium precursor, a nitrogen precursor and the precursor of the n-type dopant into the reaction chamber. In cases in which the n-type dopant is silicon, the precursor of the n-type dopant may be silane ($SiR_4$).

Next, in operation 515, an active layer is formed adjacent to the n-type Group III-V semiconductor layer. In some embodiments, the active layer includes a quantum well material, such as multiple quantum well (MQW) material. The active layer is formed by forming one or more well layers that alternate with one or more barrier layers. In an example, the active layer includes GaN (or AlN) barrier layers and indium gallium nitride or aluminum indium gallium nitride well layers. In such a case, the active layer is formed by directing into the reaction chamber a gallium (or aluminum) precursor and a nitrogen precursor to form a barrier layer, and subsequently directing an indium precursor, gallium precursor and nitrogen precursor (and aluminum precursor, if an aluminum indium gallium nitride well layer is desired) into the reaction chamber to form a well layer. Such operations may be repeated as desired to form an active layer with a predetermined number of barrier layer and well layer stacks (or periods). In an example, the operations are repeated until an active layer having at least 1, or at least 10, or at least 20, or at least 50, or at least 100 periods is formed.

Next, in operation 520, a p-type Group III-V semiconductor layer is formed adjacent to the active layer. The p-type Group III-V semiconductor layer is formed by directing a Group III precursor, a Group V precursor and the precursor of a p-type dopant into the reaction chamber. In an example, with the p-type Group III-V semiconductor layer including p-GaN, the p-GaN layer is formed by directing a gallium precursor, a nitrogen precursor and the precursor of the p-type dopant (e.g., biscyclopentadienyl magnesium for a magnesium dopant) into the reaction chamber. In some cases, following the formation of the p-type Group III-V semiconductor layer, a layer of a reflective material (e.g., Ag) is formed on the p-type Group III-V semiconductor layer. A protective metal layer may then be formed over the layer of the reflective material. In some cases, the protective metal layer includes one or more of gold, platinum, titanium, tungsten, nickel. The protective metal layer may be formed with the aid of various deposition techniques, such as physical vapor deposition (e.g., magnetron sputtering).

Next, in operation 525, a second substrate is provided adjacent to the p-type Group III-V semiconductor layer. In some cases, the second substrate is selected from silicon, germanium, silicon oxide, silicon dioxide, titanium oxide, titanium dioxide, sapphire, silicon carbide (SiC), a ceramic material (e.g., alumina, AlN) and a metallic material (e.g., molybdenum, tungsten, copper, aluminum). In some situations, the second substrate is provided adjacent to the p-type Group III-V semiconductor layer by bringing the second substrate in contact with the p-type Group III-V semiconductor layer. In other cases, the second substrate has formed thereon a layer of a metallic material to aid in bonding the second substrate to the nascent light emitting diode (i.e., the device stack including the p-type Group III-V semiconductor layer over the first substrate). In an embodiment, the metallic material includes one or more metals selected from indium, copper, silver gold and tin, such as, e.g., a silver tin copper alloy or a gold tin alloy (e.g., 80% gold, 20% tin). The layer of the metallic material may be formed with the aid of various deposition techniques, such as physical vapor deposition (e.g., magnetron sputtering, evaporative deposition). Next, in operation 530, the first substrate is removed to expose the buffer layer.

Next, in operation 535, a light coupling layer is formed from the buffer layer and, in some cases, the n-type Group III-V semiconductor layer. The light coupling layer, as formed, has an opening (or orifice) extending through at least a portion of the buffer layer. In some embodiments, the light coupling layer is formed by roughening the buffer layer.

Next, in operation 540, an electrode is provided in the opening. In an embodiment, the electrode is formed with the aid of a physical vapor deposition technique, such as sputtering. The electrode is in electrical communication with the n-type Group III-V semiconductor layer. In an example, the electrode is in electrical contact with the n-type Group III-V semiconductor layer.

In some cases, at least a portion of the n-type Group III-V semiconductor layer is roughened, while the remainder (such as the portion of the n-type Group III-V semiconductor layer in the orifice) is not roughened.

During one or more of the operations of the method 500, the substrate is heated to facilitate the formation of the light emitting device. In an example, during the formation of the active layer (operation 515), the substrate is heated at a temperature between about 750° C. and 850° C.

FIGS. 6A-6L schematically illustrate a method for forming a light coupling layer, in accordance with an embodiment of the invention. FIG. 6A shows a light emitting device 600 having an n-GaN layer 605 and a buffer layer 610 over the n-GaN layer 605. The n-GaN layer is formed over an active layer and a p-GaN layer (not shown), which are formed over a substrate, such as a silicon substrate. Next, with reference to FIG. 6B, a metal layer 615 is formed over the buffer layer 610. The metal layer 615 may be formed on the buffer layer 610 using various deposition methods, such as physical vapor deposition (e.g., sputtering). The metallic material may include one or more of Au, Sn, Ag, Ni and Pt.

Next, with reference to FIG. 6C, a photodefinable layer 620 having a photodefinable material is deposited on the metal layer 615. The photodefinable material in some cases is a photoresist. In an example, the photodefinable material is a photoresist compatible with 157 nm, 193 nm, 248 nm or 365 nm wavelength photoresist systems, 193 nm wavelength immersion systems, extreme ultraviolet systems (including 13.7 nm systems) or electron beam lithographic systems. Examples of photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists may be used with photolithography systems utilizing relatively short wavelength light, e.g., 193 nm KrF photoresists may be used with longer wavelength photolithography systems, such as 248 nm systems. In other cases, nano-imprint lithography (e.g., by using a mold or mechanical force to pattern a resist) is used.

Next, with reference to FIG. 6D, a predetermined portion of the photodefinable layer 620 is removed to define an orifice 625 extending to the metal layer 615. In some cases, a portion of the photodefinable layer 620 is exposed to radiation through a reticle and then developed to define the orifice 625 in the photodefinable layer 620. The predetermined portion 625 is then removed by washing the exposed and developed portion of the photodefinable layer 620. For example, the orifice is defined in the photodefinable layer by photolithography with 248 nm or 193 nm light, in which the photodefinable layer is exposed to radiation through a reticle and then developed. After being developed, the remaining photodefined material forms mask features.

Next, with reference to FIG. 6E, the exposed portion 625 of the metal layer 615 is etched to the buffer layer 610. This may be accomplished with the aid of a chemical etchant that selectively etches the metal layer 615 but not the photodefinable layer 620. Suitable chemical etchants include KCN, KI:I$_2$, HCl: HNO$_3$, HNO$_3$:H$_2$O, NH$_4$OH:H$_2$O$_2$, sodium hydroxide and/or potassium hydroxide, an Ar ion-beam sputtering, a Cl$_2$ plasma, an HBr plasma.

Next, with reference to FIG. 6F, the photodefinable layer 620 is removed to expose the layer of the metal layer 615 over the buffer layer 610. The metal layer 615 is then heated to generate metal particles 630 from the metal layer, as shown in FIG. 6G. In some cases, the metal layer 615 is heated to a temperature less than about 700° C., or less than about 600° C., or less than about 500° C., or less than about 400° C., or less than about 300° C. Heating may be accomplished with the aid of resistive heating (e.g., by resistively heating a susceptor supporting the substrate, see FIG. 7) and/or exposure of the metal layer 615 to infrared radiation. The metal particles 630 expose portions of the buffer layer 610 between the metal particles 630.

Next, with reference to FIG. 6H, the buffer layer 610 is etched to form a roughened buffer layer, which defines the light coupling layer 635. The metal particles 630 are etched away or removed with the aid of a chemical etchant that is selective to the metal particles 630. The portion of the buffer layer 610 not covered by metal particles 630 is etched to the n-GaN layer 605. In some embodiments, the buffer layer is roughened by etching the buffer layer, such as with the aid of an etching process (e.g., wet etching or dry etching). In an example, the buffer layer is etched with the aid of sodium hydroxide (NaOH), potassium hydroxide (KOH), a Cl$_2$ plasma, and/or an HBr plasma. In other embodiments, the buffer layer is roughened by sputtering the buffer layer. In an example, the buffer layer is roughened by sputtering the buffer layer with argon (Ar) ions.

In some cases, with the buffer layer 610 formed of u-GaN, AlGaN and AlN, the roughening process removes all of the AlN layer and leaves all or some of the AlGaN layer over the u-GaN layer. In other cases, the roughening process removes the AlN layer and the AlGaN layer, but leaves at least a portion of the u-GaN layer. In other cases, the roughening process etches a portion of the n-GaN layer 605. Thus, the light coupling layer 635 may include n-GaN in addition to the material including the buffer layer 610, such as u-GaN, AlGaN and/or AlN. In some cases, the buffer layer 610 is formed of AlGaN adjacent to the n-GaN layer 605 and an AlN layer adjacent to the AlGaN layer, and the roughening process etches some or all of the AlN layer and, in some situations, some of the AlGaN layer.

Next, with reference to FIG. 6I, a photodefinable layer 640 is formed over the light coupling layer 635. The photodefinable layer 640 includes a photodefinable material, such as a photoresist. Next, a portion of the photodefinable layer 640 is then exposed and developed (e.g., with the aid of a reticle) to form an orifice 645 extending through the photodefinable layer 640 to the n-GaN layer 605, as illustrated in FIG. 6J.

Next, with reference to FIG. 6K, an electrode 650 is formed in the orifice 645. The electrode is formed by depositing one or more metals in the orifice 645, such as by physical vapor deposition (e.g., sputtering). The electrode 650 is formed by depositing one or more of titanium, aluminum, nickel, platinum, gold, silver, rhodium, copper and chromium in the orifice 645. The electrode 650 is in electrical communication with the n-GaN layer 605. In the illustrated embodiment, the electrode 650 is in contact with the n-GaN layer 605. The photodefinable material is then removed to provide the light coupling layer 635 over the n-GaN layer 605, as shown in FIG. 6L.

As an alternative, following the formation of the orifice 625 (see FIG. 6D), the metal layer 615 and the buffer layer 610 are etched to the n-GaN layer 605 (i.e., the buffer layer 610 is also removed). Next, the electrode 650 is formed by depositing one or more metals in the orifice 625. The photodefinable layer 620 is then removed and the metal layer is 615 is heated to form metal particles over the buffer layer 610. The buffer layer 610 is subsequently etched (or roughened) to form the light coupling layer 635. In such a case, the electrode 650 may be formed on the n-GaN layer without the need for the photodefinable layer 640 and the associated processing operations.

In some embodiments, during the formation of various device layers, the substrate is exposed to a Group III precursor and a Group V precursor simultaneously. In other situations, during the formation of various device layers, the substrate is exposed to the Group III precursor and the Group V in an alternating fashion—e.g., the Group III precursor followed by the Group V precursor, with an intervening purging or evacuation operation. Generally, if a plurality of precursor are required to form a device layer, the precursor may be directed into the reaction chamber simultaneously or in an alternating and sequential fashion.

Device layers may be formed with the aid of various deposition techniques. In some embodiments, device layers are formed with the aid of chemical vapor deposition (CVD), atomic layer deposition (ALD), plasma enhanced CVD (PECVD), plasma enhanced ALD (PEALD), metal organic CVD (MOCVD), hot wire CVD (HWCVD), initiated CVD (iCVD), modified CVD (MCVD), vapor axial deposition (VAD), outside vapor deposition (OVD) and physical vapor deposition (e.g., sputter deposition, evaporative deposition).

While methods and structures provided herein have been described in the context of light emitting devices having Group III-V semiconductor materials, such as, for example, gallium nitride, such methods and structures may be applied to other types of semiconductor materials. Methods and structures provided herein may be used with light emitting devices formed at least in part of gallium nitride (GaN), gallium arsenide (GaAs), aluminum gallium arsenide (AlGaAs), gallium arsenide phosphide (GaAsP), aluminum gallium indium phosphide (AlGaInP), gallium phosphide (GaP), indium gallium nitride (InGaN), aluminum gallium phosphide (AlGaP), zinc selenide (ZnSe), aluminum nitride (AlN), aluminum gallium nitride (AlGaN), and aluminum gallium indium nitride (AlGaInN).

Systems Configured to Form Light Emitting Devices

In another aspect of the invention, a system for forming a light emitting device includes a reaction chamber for holding a substrate, a pumping system in fluid communication with the reaction chamber, the pumping system configured to purge or evacuate the reaction chamber, and a computer system having a processor for executing machine readable code implementing a method for forming the light emitting device. The code may implement any of the methods provided herein. In an embodiment, the code implements a method including providing, in a reaction chamber, a substrate having disposed thereon a light coupling layer (or structure), the light coupling layer including one or more Group III-V semiconductor materials, and forming an electrode on a portion of the light coupling layer, the electrode in electrical communication with one of an n-type semiconductor layer and a p-type semiconductor layer adjacent to the light coupling layer. In another embodiment, the code implements a method including providing, in a reaction chamber, a substrate having a buffer layer, and roughening the buffer layer to form a light coupling layer.

Figure 7:
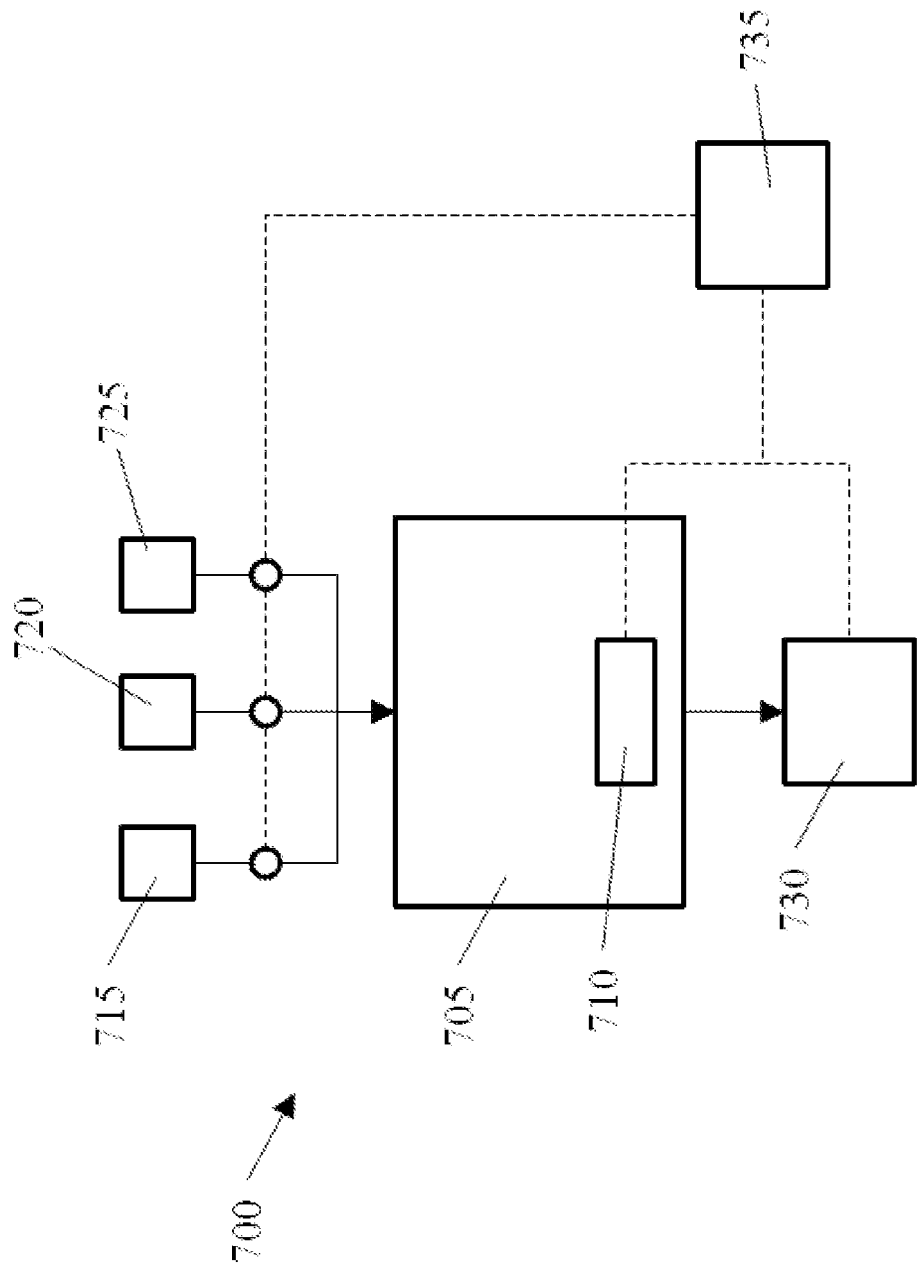
FIG. 7 shows a system for forming a light emitting device, in accordance with an embodiment of the invention.

FIG. 7 shows a system 700 for forming a light emitting device, in accordance with an embodiment of the invention. The system 700 includes a reaction chamber 705 having a susceptor (or substrate holder) 710 configured to hold a substrate that is used to form the light emitting device. The system includes a first precursor storage vessel (or tank) 715, a second precursor storage vessel 720, and a carrier gas storage tank 725. The first precursor storage vessel 715 may be for holding a Group III precursor (e.g., TMG) and the second precursor storage vessel 720 may be for holding a Group V precursor (e.g., $NH_3$). The carrier gas storage tank 725 is for holding a carrier gas (e.g., $H_2$). The system 700 may include other storage tanks or vessels, such as for holding additional precursors and carrier gases. The system 700 includes valves between the storage vessels and the reaction chamber 705 for fluidically isolating the reaction chamber 705 from each of the storage vessels.

The system 700 further includes a vacuum system 730 for providing a vacuum to the reaction chamber 705. The vacuum system 730 is in fluid communication with the reaction chamber 705. In some cases, the vacuum system 730 is configured to be isolated from the reaction pace 705 with the aid of a valve, such as a gate valve.

A controller (or control system) 735 of the system 700 facilitates a method for forming a light emitting device in the reaction chamber 705, such as forming one or more layers of the light emitting device. The controller 735 is communicatively coupled to a valve of each of the first precursor storage vessel 715, the second precursor storage vessel 720, the carrier gas storage tank 725 and the vacuum system 730. The controller 735 is operatively coupled to the susceptor 710 for regulating the temperature of the susceptor and a substrate on the susceptor, and the vacuum system 730 for regulating the pressure in the reaction chamber 705.

In some situations, the vacuum system 730 includes one or more vacuum pumps, such as one or more of a turbomolecular ("turbo") pump, and a diffusion pump and a mechanical pump. A pump may include one or more backing pumps. For example, a turbo pump may be backed by a mechanical pump.

In some embodiments, the controller 735 is configured to regulate one or more processing parameters, such as the substrate temperature, precursor flow rates, growth rate, carrier gas flow rate and reaction chamber pressure. The controller 735, in some cases, is in communication with valves between the storage vessels and the reaction chamber 705, which aids in terminating (or regulating) the flow of a precursor to the reaction chamber 705. The controller 735 includes a processor configured to aid in executing machine-executable code that is configured to implement the methods provided herein. The machine-executable code is stored on a physical storage medium, such as flash memory, a hard disk, or other physical storage medium configured to store computer-executable code.

In some embodiments, the controller 735 is configured to regulate one or more processing parameters. In some situations, the controller 735 regulates the growth temperature, carrier gas flow rate, precursor flow rate, growth rate and/or growth pressure.

Unless the context clearly requires otherwise, throughout the description and the claims, words using the singular or plural number also include the plural or singular number respectively. Additionally, the words 'herein,' 'hereunder,' 'above,' 'below,' and words of similar import refer to this application as a whole and not to any particular portions of this application. When the word 'or' is used in reference to a list of two or more items, that word covers all of the following interpretations of the word: any of the items in the list, all of the items in the list and any combination of the items in the list.

It should be understood from the foregoing that, while particular implementations have been illustrated and described, various modifications may be made thereto and are contemplated herein. It is also not intended that the invention be limited by the specific examples provided within the specification. While the invention has been described with reference to the aforementioned specification, the descriptions and illustrations of embodiments of the invention herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents.

What is claimed is:

1. A method for forming a light emitting device, comprising:
   forming a buffer layer;
   roughening a portion of the buffer layer to form a light coupling layer; and
   forming an electrode on the light coupling layer,
   wherein the light coupling layer is formed adjacent to one of an n-type semiconductor layer and a p-type semiconductor layer,
   wherein said one of either the n-type semiconductor layer or the p-type semiconductor layer is formed adjacent to an active layer,
   wherein said active layer is formed adjacent to the other of the n-type semiconductor layer and the p-type semiconductor layer,
   wherein said the other of the n-type semiconductor layer and the p-type semiconductor layer is formed adjacent to a support substrate,
   wherein the light coupling structure has a corrugated surface including a first corrugation portion and comprises an orifice extending to said one of either the n-type semiconductor layer or the p-type semiconductor layer, the orifice including a second corrugation portion different from the first corrugation portion, and
   wherein the electrode is formed on the second corrugation portion in the orifice, the electrode in electrical communication with said one of either the n-type semiconductor layer or the p-type semiconductor layer.

2. The method of claim 1, wherein the buffer layer comprises one or more Group III-V semiconductor materials.

3. The method of claim 2, wherein the buffer layer comprises one or more of u-type gallium nitride, aluminum gallium nitride and aluminum nitride.

4. The method of claim 1, wherein roughening the portion of the buffer layer comprises:
   forming a layer of a metallic material over the buffer layer;
   defining an opening in the layer of the metallic material, the opening extending to the buffer layer;
   forming metallic particles from the layer of the metallic material; and
   etching the buffer layer.

5. The method of claim 1, further comprising providing, in a reaction chamber, a substrate comprising the buffer layer.

6. The method of claim 1, wherein said one of an n-type semiconductor layer and a p-type semiconductor layer is a p-type semiconductor layer.

7. A method for forming a light emitting device, comprising:
   forming a buffer layer;
   forming an n-type Group III-V semiconductor layer on the buffer layer;
   forming an active layer on the n-type Group III-V semiconductor layer;
   forming a p-type Group III-V semiconductor layer on the active layer;
   forming a light coupling structure on the n-type Group III-V semiconductor layer, the light coupling structure comprising a corrugated surface including a first corrugation portion and a second corrugation portion different from the first corrugation portion; and
   forming an electrode on the second corrugation portion of the light coupling structure, the electrode in electrical communication with the n-type Group III-V semiconductor layer.

8. The method of claim 7, further comprising:
   forming the buffer layer on a first substrate; and
   removing the first substrate after forming the p-type Group III-V semiconductor layer,
   wherein the light coupling structure is formed on a first side of the buffer layer opposite to a second side of the buffer layer, the n-type Group III-V semiconductor layer formed on the second side of the buffer layer.

9. The method of claim 8, further comprising:
   forming a second substrate on the p-type Group III-V semiconductor layer.

10. The method of claim 9, further comprising:
    forming an optical reflector on the p-type Group III-V semiconductor layer prior to forming the second substrate.

11. The method of claim 7, wherein the light coupling structure comprises one or more Group III-V semiconductor materials.

12. The method of claim 11, wherein the one or more Group III-V semiconductor materials of the light coupling structure are selected from the group consisting of n-type gallium nitride, u-type gallium nitride, aluminum gallium nitride and aluminum nitride.

13. The method of claim 7, further comprising:
    forming an orifice in the light coupling structure prior to forming the electrode,
    wherein the second corrugation portion is formed in the orifice.

14. The method of claim 13, wherein the orifice has a circular, elliptical, triangular, square, rectangular, pentagonal, hexagonal, heptagonal or nonagonal cross-section.

15. The method of claim 13, wherein the orifice is a channel extending along at least a portion of the light coupling structure.

16. The method of claim 7, further comprising:
    forming an orifice in the light coupling structure so as to expose a portion of the n-type Group III-V semiconductor layer prior to forming the electrode,
    wherein the second corrugation portion is formed in the orifice.

17. The method of claim 7, wherein the second corrugation portion has a plurality of corrugations less than or equal to about 300 nanometers (nm).

18. The method of claim 7, wherein the light coupling structure comprises one or more light coupling moieties, an individual light coupling moiety having a decreasing width along an axis oriented away from the active layer.

19. The method of claim 7, wherein the light coupling structure comprises at least two layers of different materials, at least one of the layers comprising a u-type semiconductor layer.

20. The method of claim 7, wherein the second corrugation portion is smaller than the first corrugation portion.

\* \* \* \* \*

UNITED STATES PATENT AND TRADEMARK OFFICE
CERTIFICATE OF CORRECTION

PATENT NO. : 8,822,243 B2  Page 1 of 1
APPLICATION NO. : 14/155090
DATED : September 2, 2014
INVENTOR(S) : Li Yan It is certified that error appears in the above-identified patent and that said Letters Patent is hereby corrected as shown below:

In The Specification

Column 13, line number 32, delete "reflector" and replace with --reflector.--.
Column 19, line number 67, delete "(SiR$_4$)" and replace with --(SiH$_4$)--.
Column 21, line number 19, delete "750° C." and replace with --750 °C--.
Column 21, line number 19, delete "850° C." and replace with --850 °C.--.
Column 22, line number 9, delete "700° C." and replace with --700 °C--.
Column 22, line numbers 9-10, delete "600° C." and replace with --600 °C--.
Column 22, line number 10, delete "500° C." and replace with --500 °C--.
Column 22, line number 10, delete "400° C." and replace with --400 °C--.
Column 22, line number 10, delete "300° C." and replace with --300 °C.--.
Column 22, line number 64, delete "6L" and replace with --6L.--.

Signed and Sealed this
Twenty-seventh Day of January, 2015

Michelle K. Lee
*Deputy Director of the United States Patent and Trademark Office*